(12) United States Patent
Hattori et al.

(10) Patent No.: US 7,476,881 B2
(45) Date of Patent: Jan. 13, 2009

(54) CHARGED BEAM DRAWING APPARATUS AND CHARGED BEAM DRAWING METHOD

(75) Inventors: Kiyoshi Hattori, Tokyo (JP); Kenji Ohtoshi, Kawasaki (JP); Tomohiro Iijima, Numazu (JP); Yoshiaki Onimaru, Numazu (JP); Hayato Kimura, Numazu (JP); Tateki Watanabe, Tagata-gun (JP)

(73) Assignee: NuFlare Technology, Inc., Numazu-shi (JP)

( * ) Notice: Subject to any disclaimer, the term of this patent is extended or adjusted under 35 U.S.C. 154(b) by 240 days.

(21) Appl. No.: 11/560,127

(22) Filed: Nov. 15, 2006

(65) Prior Publication Data

US 2007/0114461 A1    May 24, 2007

(30) Foreign Application Priority Data

Nov. 17, 2005   (JP)   ............................. 2005-332998
Feb. 24, 2006   (JP)   ............................. 2006-047787

(51) Int. Cl.
*G21K 5/04* (2006.01)
(52) U.S. Cl. .............................. 250/492.22; 250/492.1; 250/492.2; 250/492.21; 250/492.3; 250/396 ML
(58) Field of Classification Search ................. 250/306, 250/307, 309, 310, 311, 396 R, 396 ML, 250/398, 492.1, 492.2, 492.21, 492.22, 492.3
See application file for complete search history.

(56) References Cited

U.S. PATENT DOCUMENTS

| 5,047,646 | A | 9/1991 | Hattori et al. |
| 2005/0253083 | A1 * | 11/2005 | Sato et al. .................... 250/398 |

FOREIGN PATENT DOCUMENTS

| JP | 3-108312 | * 5/1991 |
| JP | 2000-100363 | 4/2000 |
| JP | 2003-347188 | 12/2003 |

* cited by examiner

*Primary Examiner*—Jack I Berman
*Assistant Examiner*—Michael Maskell
(74) *Attorney, Agent, or Firm*—Oblon, Spivak, McClelland, Maier & Neustadt, P.C.

(57) ABSTRACT

There is provided a charged beam drawing apparatus which includes main/sub two-stage deflectors, divides a main deflection drawing region on a sample into sub deflection drawing regions determined by the deflection width of the sub deflector, selects one of the sub deflection drawing regions by use of the main deflector and draws shots in the selected sub deflection drawing region by use of the sub deflector. A sub deflection driving unit includes a sub deflection sensitivity correction circuit, a sub deflection astigmatic correction circuit, an adder circuit which adds an output of the sub deflection sensitivity correction circuit and an output of the sub deflection astigmatic correction circuit, and a deflection amplifier which additionally applies an output of the adder circuit to the sub deflector.

16 Claims, 17 Drawing Sheets

CHARGED BEAM DRAWING APPARATUS AND CHARGED BEAM DRAWING METHOD

CROSS-REFERENCE TO RELATED APPLICATIONS

This application is based upon and claims the benefit of priority from prior Japanese Patent Applications No. 2005-332998, filed Nov. 17, 2005; and No. 2006-047787, filed Feb. 24, 2006, the entire contents of both of which are incorporated herein by reference.

BACKGROUND OF THE INVENTION

1. Field of the Invention

This invention relates to a charged beam drawing technique of a main/sub two-stage deflection system and more particularly to a charged beam drawing apparatus and drawing method having a correction function of a sub deflection astigmatic point.

2. Description of the Related Art

In order to prevent occurrence of deflection distortion according to the deflection position of an electron beam in an electron beam drawing apparatus used for manufacturing semiconductor integrated circuits, the operations of deflection sensitivity correction and deflection astigmatic correction are performed (JP-A 2003-347188 (KOKAI) and JP-A 2000-100363 (KOKAI)). On the other hand, in an electron beam drawing apparatus of a main/sub two-stage deflection system, since a sub deflection region is small and an influence by deterioration in the CD precision due to the presence of a sub deflection astigmatic point, it is a common practice not to correct the sub deflection astigmatic point even though the main deflection astigmatic point is corrected.

However, recently, the number of deflection astigmatic points in the sub deflection increases to a value which cannot be neglected with a miniaturization of the semiconductor integrated circuit. In order to correct the sub deflection astigmatic points, it is necessary to correct the sub deflection points in the shot unit together with correction of the sub deflection sensitivity and an extremely high-speed operation is required. Therefore, it is extremely difficult to make the correction of the sub deflection astigmatic points.

In the conventional technique, methods of reducing the number of sub deflection astigmatic points by use of an alignment coil and making a sub deflection region small in order to reduce an influence by the sub deflection points are used. However, it is difficult to attain the satisfactory correction with the above methods.

Thus, conventionally, it is required to perform the high-speed operation in order to make the correction of the sub deflection points in the main/sub two-stage deflection system and it becomes extremely difficult to make the correction of the sub deflection astigmatic point. Therefore, there occurs a problem that the drawing precision is lowered due to the influence of the sub deflection astigmatic points. Further, it can be said that the above problem occurs not only in the electron beam drawing apparatus but also in an ion beam drawing apparatus.

BRIEF SUMMARY OF THE INVENTION

According to a first aspect of this invention, there is provided a charged beam drawing apparatus which draws a desired pattern on a sample by use of a charged beam deflected in main/sub two stages, comprising a main deflector which deflects a charged beam, the main deflector sequentially selecting a plurality of sub-deflection drawing regions obtained by dividing a main deflection drawing region of a sample, a main deflection driving unit which drives the main deflector, a sub deflector which deflects the charged beam in the selected sub deflection region, the sub deflector drawing a pattern in the selected sub deflection region, and a sub deflection driving unit which drives the sub deflector, the sub deflection driving unit including a sub deflection sensitivity correction circuit which corrects deflection sensitivity according to a shot position in the sub deflection region, a sub deflection astigmatic correction circuit which corrects a deflection astigmatic point according to a shot position in the sub deflection region, an adder circuit which superimposes an output of the sub deflection sensitivity correction circuit and an output of the sub deflection astigmatic correction circuit and a deflection amplifier which applies an output of the adder circuit to the sub deflector.

According to a second aspect of this invention, there is provided a charged beam drawing apparatus which draws a desired pattern on a sample by use of a charged beam deflected in main/sub two stages, comprising a sub deflection astigmatic correction value calculating unit which measures a preset inclination coefficient and a sub deflection astigmatic difference of the charged particle beam by scanning a preset mark in two perpendicularly intersecting directions by use of a charged particle beam in which a sub deflection astigmatic point is corrected by use of an n-th sub deflection astigmatic correction value and calculates an (n+1)-th sub deflection astigmatic correction value used to eliminate a sub deflection astigmatic difference based on the measured preset inclination coefficient and sub deflection astigmatic difference, a sub deflection astigmatic correction coefficient calculating unit which repeatedly performs an operation of calculating sub deflection astigmatic correction values starting from the first sub deflection astigmatic correction value by use of the astigmatic correction value calculating unit until an absolute value of a difference between the n-th and (n+1)-th sub deflection astigmatic correction values becomes smaller than a preset value and calculates a sub deflection astigmatic correction coefficient which is a coefficient of a relational expression defining a sub deflection astigmatic correction amount by use of the (n+1)-th sub deflection astigmatic correction value which is finally obtained, and a drawing unit which draws a preset pattern on the sample by use of the charged particle beam in which the sub deflection astigmatic point is corrected according to the relational expression containing the calculated sub deflection astigmatic correction coefficient.

According to a third aspect of this invention, there is provided a charged beam drawing method for drawing a desired pattern on a sample by use of a charged particle beam deflected in main/sub two stages, comprising measuring sub deflection astigmatic differences in two perpendicularly intersecting directions of a charged particle beam by scanning a preset mark in the two perpendicularly intersecting directions by use of the charged particle beam in which a sub deflection astigmatic point is corrected by use of an n-th sub deflection astigmatic correction value, calculating an (n+1)-th sub deflection astigmatic correction value used to eliminate a sub deflection astigmatic difference based on the n-th sub deflection astigmatic correction value, measured sub deflection astigmatic difference and preset inclination coefficient, determining whether an absolute value of a difference between the (n+1)-th sub deflection astigmatic correction value calculated and the n-th sub deflection astigmatic correction value used for calculation is smaller than a preset value, repeatedly performing operations of measuring the sub deflection astigmatic difference, calculating the sub deflection astigmatic correction value and determining whether the absolute value of the difference is smaller than the preset value starting from the first sub deflection astigmatic correction value and terminating the above operations when the absolute value of the difference between the (n+1)-th and n-th sub deflection astigmatic correction values becomes smaller than the preset value, and drawing a desired pattern on the sample by use of the charged particle beam subjected to astigmatic correction by use of the (n+1)-th sub deflection astigmatic correction value obtained when the difference becomes smaller than the preset value.

DETAILED DESCRIPTION OF THE INVENTION

There will now be described embodiments of this invention with reference to the accompanying drawings.

First Embodiment

Figure 1:
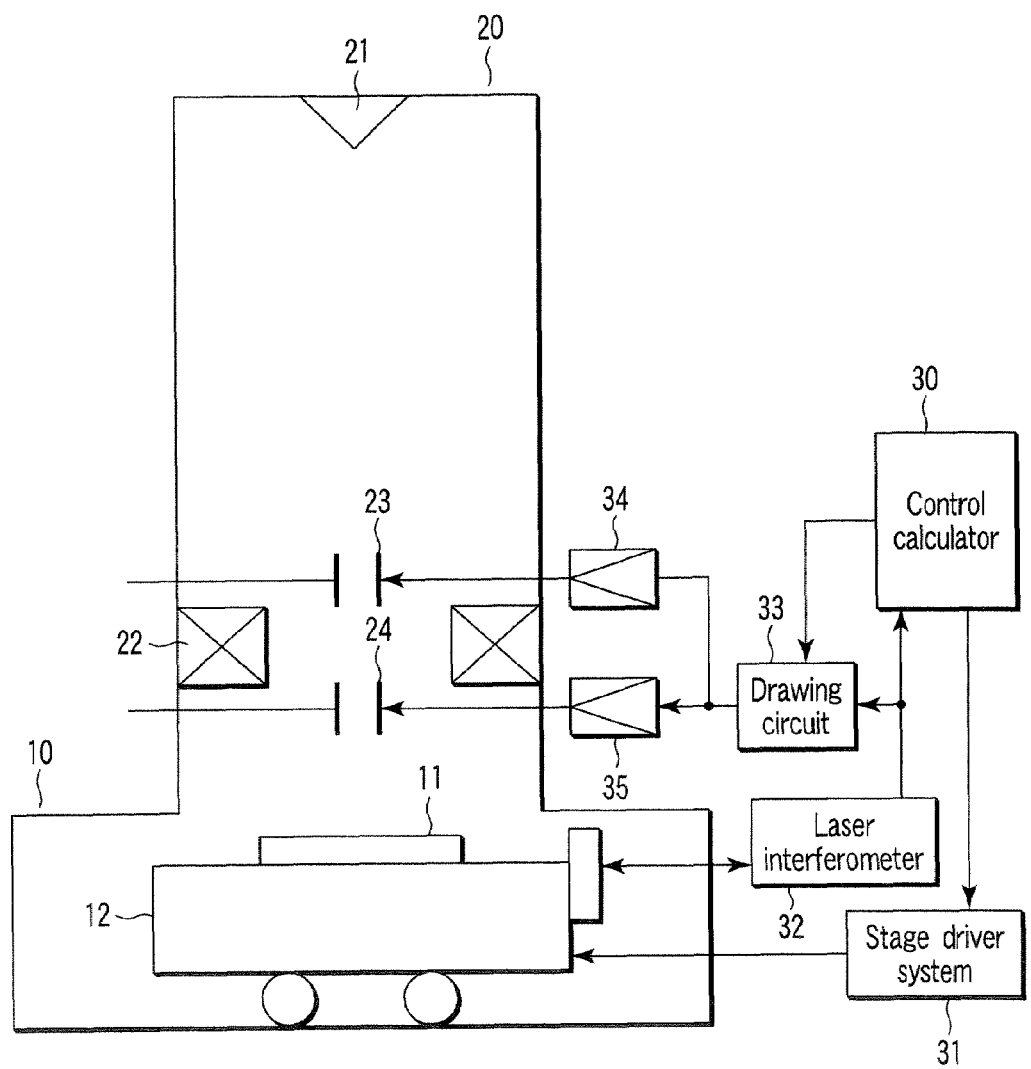
FIG. 1 is a schematic configuration diagram showing an electron beam drawing apparatus according to a first embodiment of this invention.

FIG. 1 is a schematic configuration diagram showing an electron beam drawing apparatus of a main/sub two-stage deflection system according to a first embodiment of this invention.

In FIG. 1, a reference symbol 10 denotes a sample chamber and a sample stage 12 used for mounting a sample 1 such as a semiconductor wafer or the like thereon is arranged in the sample chamber 10. The sample stage 12 can be moved in the right and left directions and in directions perpendicular to the paper sheet by a stage drive system 31 under the control of a control calculator 30. The movement position of the sample stage 12 is detected by use of a laser interferometer 32.

An electronic optical lens barrel 20 is arranged above the sample chamber 10. The electronic optical lens barrel 20 includes an electron gun 21, various lens systems (in FIG. 1, only an objective lens 22 is shown) and various deflection systems (in FIG. 1, only a main deflector 24 and sub deflector 23 are shown). An electron beam emitted from the electron gun 22 is formed into a preset form and focused on the sample surface by the objective lens 22. Deflection of the beam position is controlled by the main deflector 24 and sub deflector 23.

Drawing data is subjected to an operation process by a drawing circuit 33 connected to the control calculator 30 and the drawing data subjected to the operation process by the drawing circuit 33 is supplied to a main deflection amplifier 35 and sub deflection amplifier 34. Then, a sub field is positioned by the main deflector 24 and the process of drawing the sub field is performed by the sub deflector 23.

Figure 2:
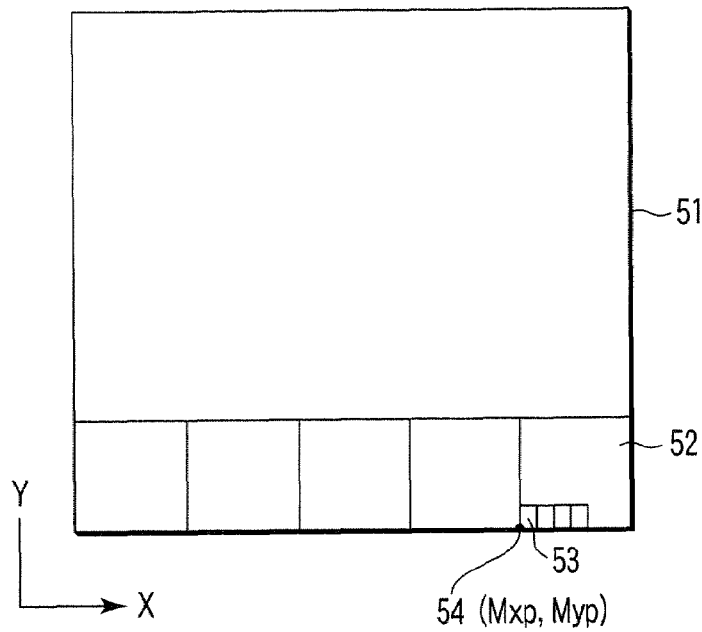
FIG. 2 is a diagram showing the relation between the main deflection region, sub deflection regions and shots.

In this case, the relation between the drawing region (main deflection region), sub deflection regions (sub fields) and shots is shown in FIG. 2. That is, a main deflection region 51 is divided into sub fields 52 determined by the deflection width of the sub deflector 23 and a pattern is drawn in the sub field 52 by use of shots. That is, a sub field is selected by the main deflector 24 and a pattern is drawn in the selected sub field 52 by use of shots of a beam which is positioned by the sub deflector 23. In FIG. 2, a reference symbol 53 denotes a shot (x, y) and 54 denotes an origin coordinate (Mxp, Myp) of the sub field.

Figure 3:
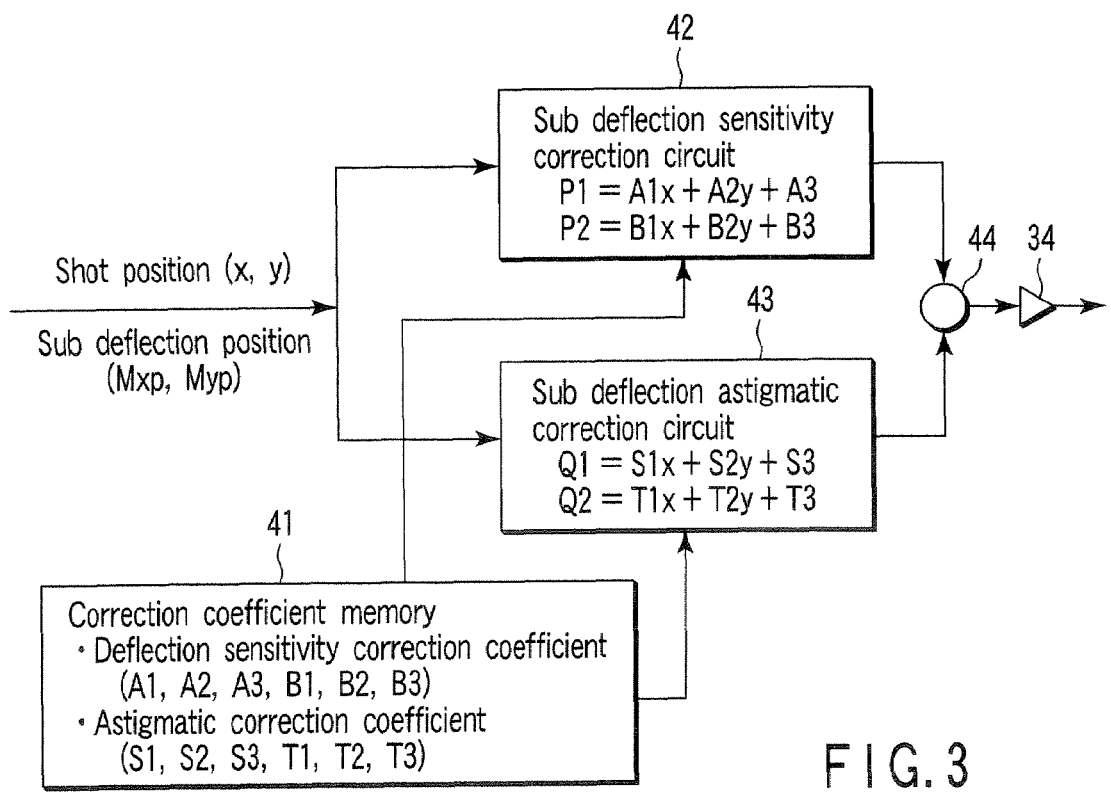
FIG. 3 is a block diagram showing the configuration of a sub deflection driving unit.

As shown in FIG. 3, a sub deflection drive unit for sub deflection in the drawing circuit 33 includes a correction coefficient memory 41, sub deflection sensitivity correction circuit 42, sub deflection astigmatic correction circuit 43 and adder circuit 44. In this case, it is supposed that a correction circuit which is conventionally generally used is provided in a main deflection drive unit for main deflection and the explanation thereof is omitted here.

Figure 4:
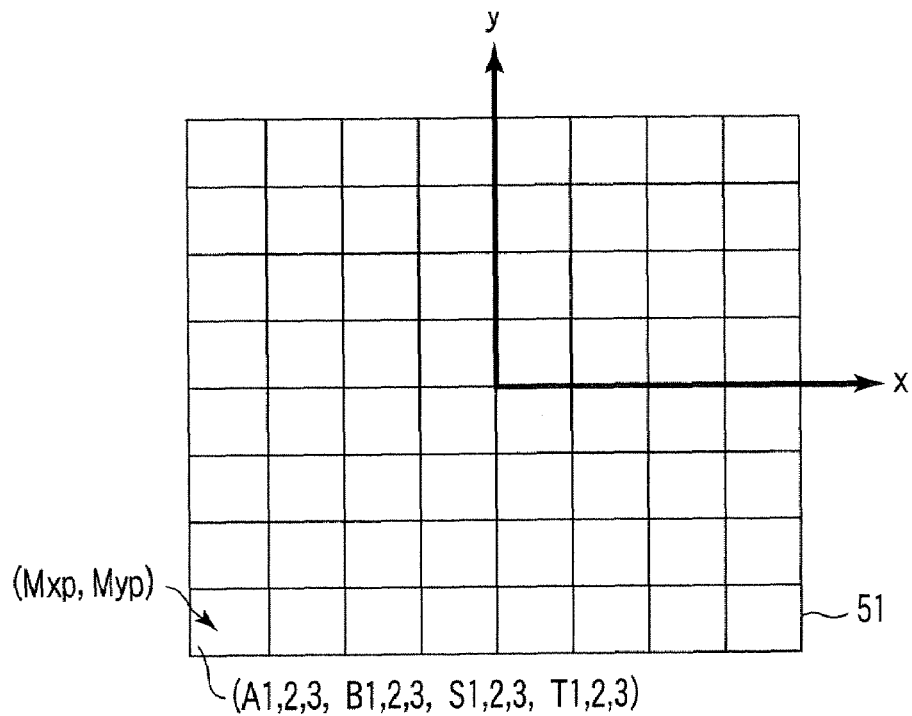
FIG. 4 is a diagram showing the contents of a correction coefficient memory.

As shown in FIG. 4, the correction coefficient memory 41 stores deflection sensitivity correction coefficients ($A_1$, $A_2$, $A_3$, $B_1$, $B_2$, $B_3$) relating to sub deflection and deflection astigmatic correction coefficients ($S_1$, $S_2$, $S_3$, $T_1$, $T_2$, $T_3$) relating to sub deflection for respective meshes obtained by dividing the main deflection region. In the present embodiment, the size of each mesh is set larger than the sub field, but it can be made equal to or smaller than the sub field. As the mesh is made smaller, the precision becomes higher, but the capacity required for the memory becomes larger.

The deflection astigmatic correction coefficients relating to sub deflection can be derived by a process in a second embodiment which will be described later.

The sub deflection sensitivity correction circuit 42 corrects and calculates the deflection sensitivity for each shot position based on the deflection sensitivity correction coefficient. The sub deflection astigmatic correction circuit 43 corrects and calculates a deflection astigmatic point for each shot position based on the astigmatic correction coefficient. The adder circuit 44 adds outputs of the sub deflection sensitivity correction circuit 42 and sub deflection astigmatic correction circuit 43 and outputs the addition result to the sub deflection amplifier 34.

In the sub deflection drive unit, when certain sub deflection (sub field) position information is input, a difference between the position information and a present laser value (stage position information) is calculated. Then, the sub field position information is converted into a main deflection coordinate and a sub deflection position (Mxp, Myp) is obtained. The deflection sensitivity correction coefficients ($A_1$, $A_2$, $A_3$, $B_1$, $B_2$, $B_3$) and deflection astigmatic correction coefficients ($S_1$, $S_2$, $S_3$, $T_1$, $T_2$, $T_3$) are read out from the correction coefficient memory 41 based on the above coordinate and the respective coefficients are set in the sub deflection sensitivity correction circuit 42 and sub deflection astigmatic correction circuit 43. Then, the operation of correcting and calculating the deflection sensitivity for each shot position (x, y) is performed based on the thus set deflection sensitivity correction coefficients by the sub deflection sensitivity correction circuit 42. Likewise, the operation of correcting and calculating the deflection astigmatic point for each shot position (x, y) is performed based on the thus set deflection astigmatic correction coefficients by the sub deflection astigmatic correction circuit 43. That is, $P_1$ and $P_2$ are calculated according to the following equations by use of the sub deflection sensitivity correction circuit 42.

$$P_1 = A_1 x + A_2 y + A_3$$

$$P_2 = B_1 x + B_2 y + B_3$$

Further, $Q_1$ and $Q_2$ are calculated according to the following equations by use of the sub deflection astigmatic correction circuit 43.

$$Q_1 = S_1 x + S_2 y + S_3$$

$$Q_2 = T_1 x + T_2 y + T_3$$

Then, the operation results obtained in the sub deflection sensitivity correction circuit 42 and sub deflection astigmatic correction circuit 43 are added in adequately adjusted timing by the adder 44 and the addition result is supplied to the sub deflection amplifier 34.

Thus, in the present embodiment, a sub deflection astigmatic correction value can be calculated at high speed by operating the sub deflection astigmatic correction circuit 43 having the same configuration as that of the sub deflection sensitivity correction circuit 42 in parallel with the sub deflection sensitivity correction circuit 42. The calculated astigmatic correction value is finally added to the drive voltage of the sub deflector. Further, the correction coefficient memory 41 has a map corresponding to the field in the main deflection region and has a circuit configuration to obtain the coefficients based on a mesh corresponding to the sub deflection position if the sub deflection position is determined.

In this case, it is required to perform the high-speed operation in order to correct both of the sub deflection sensitivity and sub deflection astigmatic point and it is difficult to make the correction of both of them. The reason is to prevent the operation time from limiting the drawing time. That is, this is because the position correcting operation in the shot unit is performed in a pipe-line system (a method for outputting one data item from the final stage each time one data item is input from the upstream and sequentially processing data in the internal portion) and data is sequentially transferred and processed in a cycle which is shorter than the drawing time of one shot. If the operation for calculating the astigmatic point is performed after the end of the operation of one shot, it becomes clear that the operation time limits the drawing time and the drawing time is delayed.

In the present embodiment, as a method for performing the high-speed operation, a method of deriving an astigmatic correction value by driving a circuit having the same configuration as the sub deflection sensitivity correction circuit in parallel with the above circuit is provided. Thus, it is featured that deflection voltage and astigmatic correction voltage are applied to each electrode by adding the deflection voltage to the astigmatic correction value when deflection data items are finally allocated to the respective electrodes. At this time, even if a difference occurs between the operation times thereof, the operation times may be synchronized at the final stage and the sub deflection astigmatic point may be corrected for each shot.

Map information of the correction coefficient memory 41 is previously calculated based on the cubic polynomial before drawing and set.

The calculation of the cubic polynomial is expressed as follows.

$$fn(x,y) = a_0 + a_1 x + a_2 y + a_3 x^2 + a_4 xy + a_5 y^2 + a_6 x^3 + a_7 x^2 y + a_8 xy^2 + a_9 y^3$$

In this case, coefficients $a_{0,1,2,\ldots 9}$ are separately provided for the coefficients ($A_{1,2,3}$, $B_{1,2,3}$, $S_{1,2,3}$, $T_{1,2,3}$). The coefficients $a_{0,1,2,\ldots 9}$ can be derived by moving a mark attached to the stage to at least ten desired positions in the main deflection region, measuring the sub deflection sensitivity and sub deflection astigmatic points in the respective positions and using the measurement result.

In this case, as shown in FIG. 4, if the main deflection field is uniformly divided to define meshes and a certain desired mesh coordinate is set to (Mxp, Myp), coefficients A, B, S, T set in the mesh are expressed as follows.

$$A_1=fa1(Mxp,Myp), A_2=fa2(Mxp,Myp), A_3=fa3(Mxp, Myp)$$

$$B_1=fb1(Mxp,Myp), B_2=fb2(Mxp,Myp), B_3=fb3(Mxp, Myp)$$

$$S_1=fs1(Mxp,Myp), S_2=fs2(Mxp,Myp), S_3=fs3(Mxp, Myp)$$

$$T_1=ft1(Mxp,Myp), T_2=ft2(Mxp,Myp), T_3=ft3(Mxp, Myp)$$

Based on the above equations, coefficients corresponding to all of the mesh coordinates are previously calculated before drawing and written into corresponding memory areas. Then, the results obtained in the respective circuits are finally superimposed on data items of the respective electrodes and output to the deflection amplifier. Thus, the high-speed operation can be attained by performing the operations in parallel.

Figure 5:
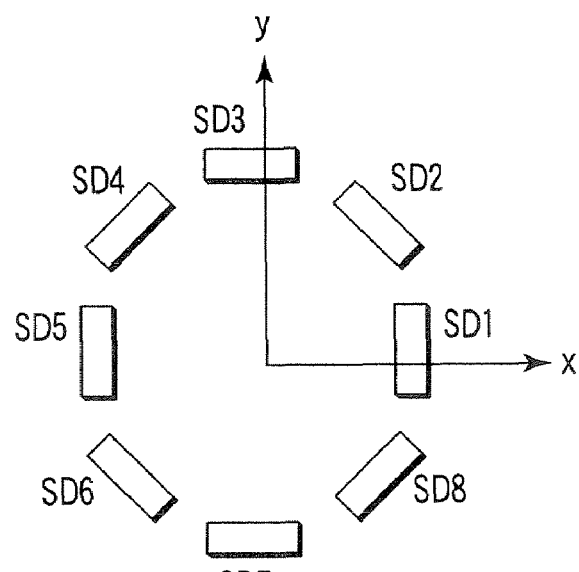
FIG. 5 is a diagram showing the concrete configuration of a sub deflector.

In the actual circuit, the following operation is performed according to the type of the deflector based on a shot position ($P_1$, $P_2$) and sub deflection astigmatic correction data ($Q_1$, $Q_2$) calculated by performing the parallel pipeline operation. In this case, k1, k2 are proportional constants. As shown in FIG. 5, the sub deflector 34 is an octopole electrode having eight electrodes (SD1 to SD8).

$$SD1=P_1+Q_1/k1$$

$$SD2=(P_1+P_2)/\sqrt{2}+Q_2/k2$$

$$SD3=P_2+Q_1/k1$$

$$SD4=(-P_1+P_2)/\sqrt{2}-Q_2/k2$$

$$SD5=-P_1+Q_1/k1$$

$$SD6=(-P_1-P_2)/\sqrt{2}+Q_2/k2$$

$$SD7=-P_2-Q_1/k1$$

$$SD8=(P_1-P_2)/\sqrt{2}-Q_2/k2$$

If the above data items are input to a deflection amplifier (DAC/AMP), voltages can be applied to the respective deflection electrodes. Thus, astigmatic correction data is superimposed on deflection data and voltage corresponding to the superimposed data is applied to the electrostatic deflector.

More specifically, as sub deflection astigmatic points caused by the processing precision of the electrodes of the sub deflection 34, astigmatic points in directions of 0° to 90° and astigmatic points in directions of 45° to 135° are provided and respectively expressed as $Q_1$, $Q_2$. Shot deflection amounts $P_1$, $P_2$ and astigmatic correction points $Q_1$, $Q_2$ are subjected to the parallel calculating operation and finally superimposed on each other according to the above equations and applied to the octa-pole electrostatic deflector.

According to the present embodiment, the sub deflection sensitivity correction circuit 42 which corrects the deflection sensitivity and the sub deflection astigmatic correction circuit 43 which corrects the deflection astigmatic point are separately provided and are operated in parallel to perform the operation for deflection astigmatic correction which is independent from the deflection sensitivity. Therefore, the sub deflection astigmatic correcting operation can be performed at high speed and the drawing precision can be enhanced.

In this case, the number of orders of the correction equations used in the sub deflection sensitivity and sub deflection astigmatic correction circuits which perform the parallel operation may be different. For example, the sub deflection sensitivity correcting operation can be expressed by the following quadratic equations.

$$P1=A_0+A_1x+A_2y+A_3x^2+A_4xy+A_5y^2$$

$$P2=B_0+B_1x+B_2y+B_3x^2+B_4xy+B_5y^2$$

Thus, the same effect of astigmatic correction can be attained without degrading the high-speed operation by enhancing the deflection sensitivity correction precision, setting the final output timing equal to the output timing of the sub deflection astigmatic point and then adding the outputs.

Second Embodiment

Figure 6:
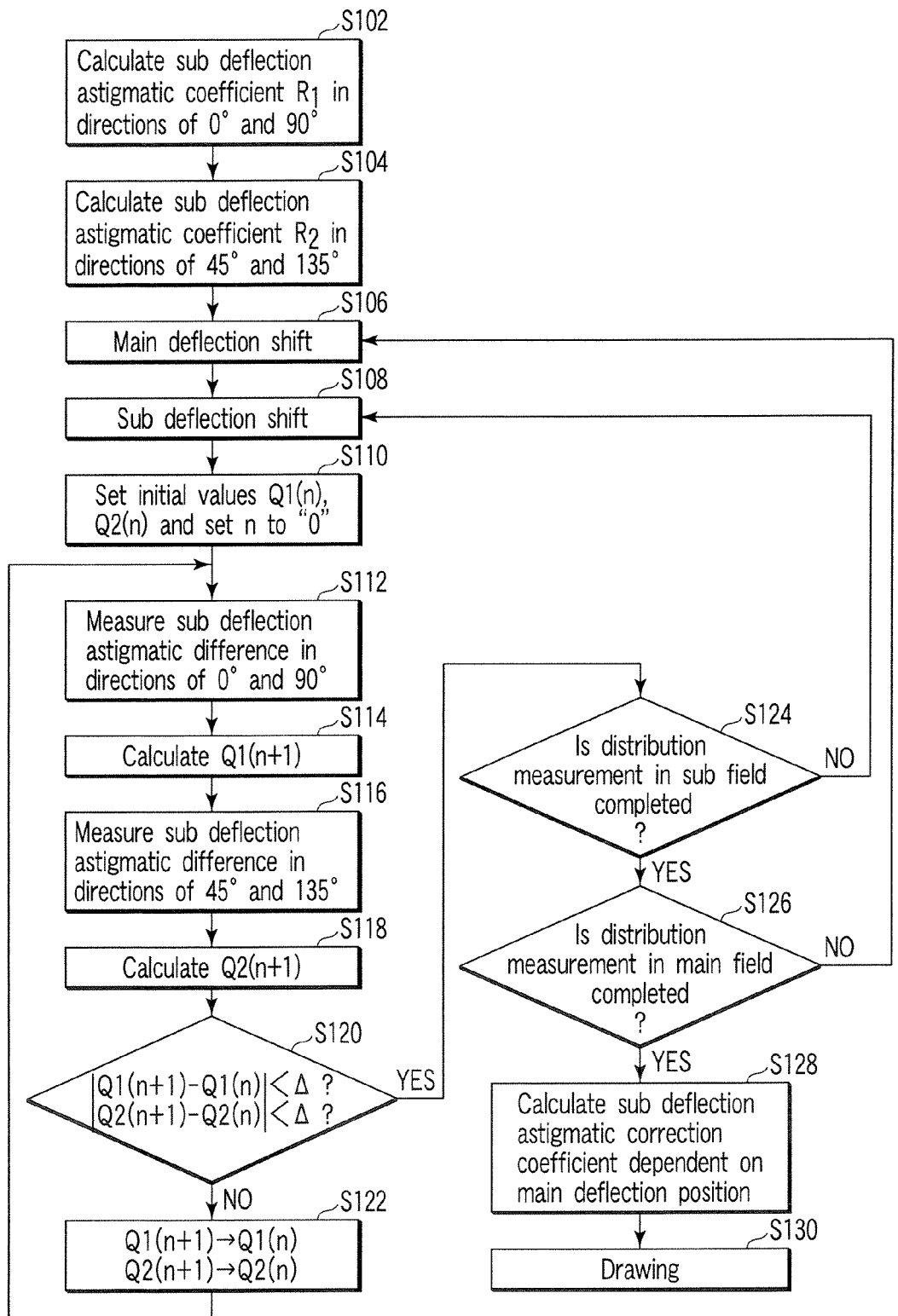
FIG. 6 is a flowchart for illustrating an electron beam drawing method according to a second embodiment of this invention.

FIG. 6 is a diagram showing the main portion of a flowchart for illustrating an electron beam drawing method according to a second embodiment of this invention.

In the electron beam drawing method of this embodiment, a process including the calculation step (S102) of calculating a sub deflection astigmatic coefficient $R_1$ in the directions of 0° and 90°, the calculation step (S104) of calculating a sub deflection astigmatic coefficient $R_2$ in the directions of 45° and 135°, the main deflection shifting step (S106), the sub deflection shifting step (S108), the initial value setting step (S110), the sub deflection astigmatic difference measuring step (S112) in the directions of 0° and 90°, the calculation step (S114) of calculating a sub deflection astigmatic correction value $Q_1(n+1)$, the sub deflection astigmatic difference measuring step (S116) in the directions of 45° and 135°, the calculation step (S118) of calculating a sub deflection astigmatic correction value $Q_2(n+1)$, the determination step (S120), the re-setting step (S122) of $Q_1(n)$ and $Q_2(n)$, the distribution measurement end determination step (S124) in the sub deflection field, the distribution measurement end determination step (S126) in the main deflection field, the sub deflection astigmatic coefficient calculating step (S128) dependent on the main deflection position and the drawing step (S130) is performed.

Figure 7:
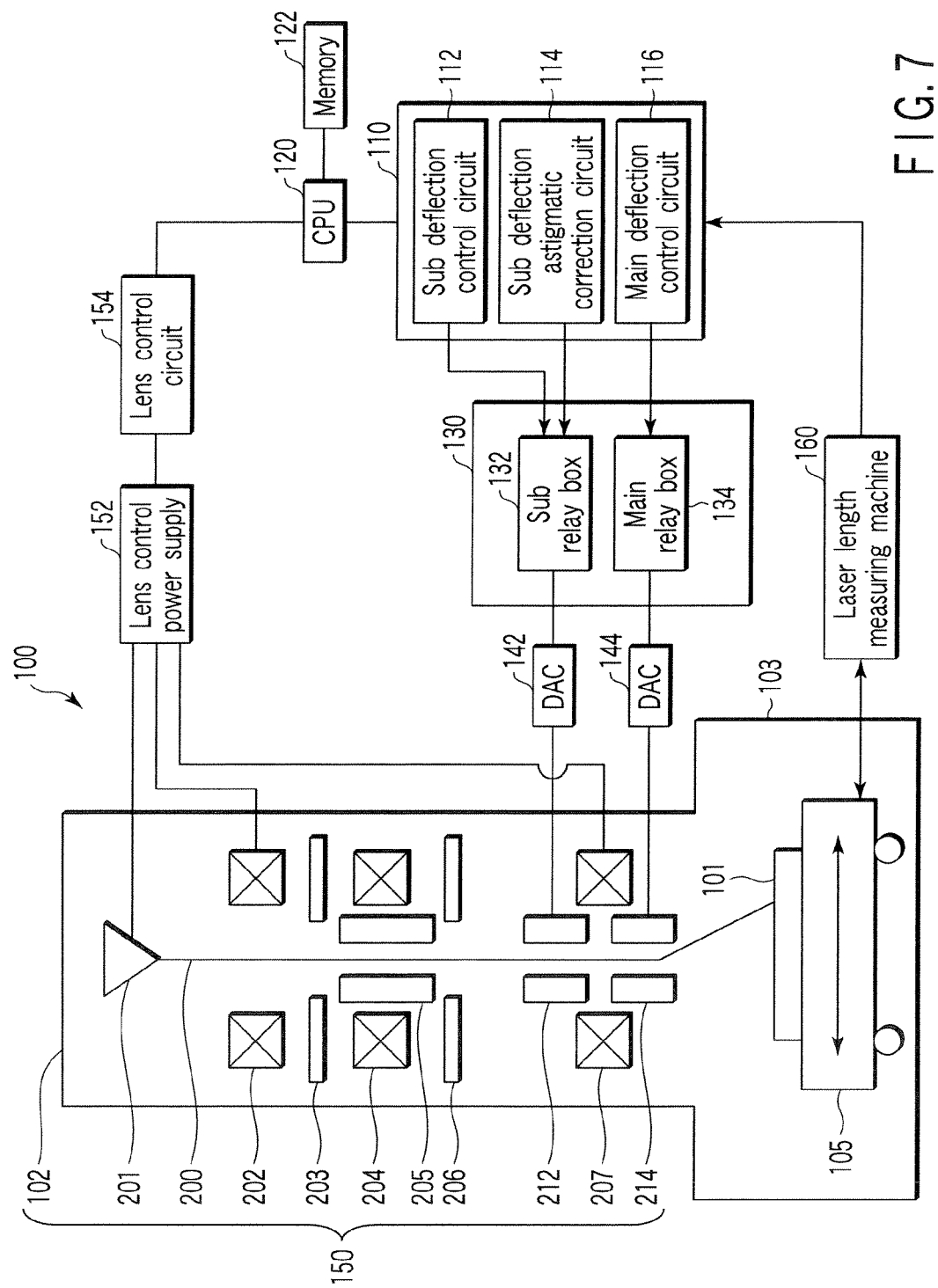
FIG. 7 is a conceptual diagram showing the configuration of an electron beam drawing apparatus used in the second embodiment.

FIG. 7 is a conceptual diagram showing the configuration of an electron beam drawing apparatus used in the method of the present embodiment.

In FIG. 7, an electron beam drawing apparatus 100 which is one example of a charged particle beam drawing apparatus includes an electronic optical lens barrel 102, drawing chamber 103, XY stage 105, electron gun 201, illumination lens 202, first aperture 203, projection lens 204, formation deflector 205, second aperture 206, objective lens 207, sub deflector 212 and main deflector 214 which configure a drawing unit 150.

Further, it includes a deflection control circuit 110, CPU 120, memory 122, digital-analog converter (DAC) relay box 130, digital-analog converter (DAC) 142, digital-analog converter (DAC) 144, lens control circuit 154, lens control power supply 152 and laser length measuring machine 160 as a control system. The deflection control circuit 110 includes a sub deflection control circuit 112, sub deflection astigmatic correction circuit 114 and main deflection control circuit 116. The DAC relay box 130 includes a sub relay box 132 and main relay box 134.

The deflection control circuit 110, lens control circuit 154 and memory 122 are connected to the CPU 120 used as a computer via a bus (not shown). The deflection control circuit 110 and lens control circuit 154 are controlled by a control signal output from the CPU 120. Further, input data or output data processed by the CPU 120 is stored in the memory 122.

In the electronic optical column 102, the electron gun 201, illumination lens 202, first aperture 203, projection lens 204, shaping deflector 205, second aperture 206, objective lens 207, sub deflector 212 and main deflector 214 are arranged. In the drawing chamber 103, the XY stage 105 is arranged. In FIG. 7, a portion other than the configuration which is required for illustrating the present embodiment is omitted. Of course, in the drawing apparatus 100, the other configuration generally required is contained.

The illumination lens 202, projection lens 204 and objective lens 207 are controlled by respectively passing desired excitation currents through them from the lens control power supply 152 controlled by the lens control circuit 154.

Further, the sub deflector 212 is controlled by the sub deflection control circuit 112 and sub deflection astigmatic correction circuit 114 and applied with voltage via the sub relay box 132 and DAC 142. Likewise, the main deflector 214 is controlled by the main deflection control circuit 116 and applied with voltage via the main relay box 134 and DAC 144.

Figure 8:
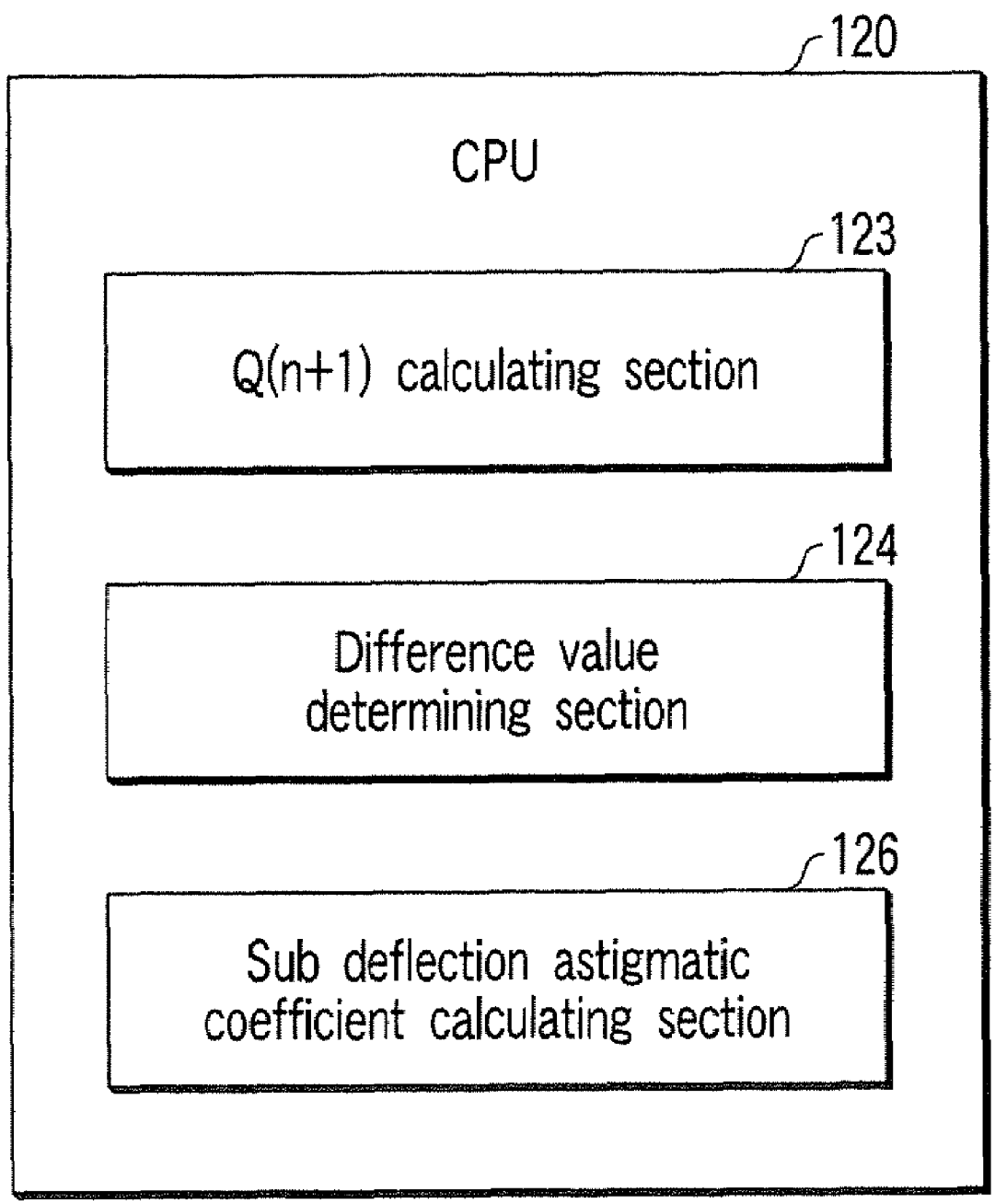
FIG. 8 is a diagram showing the configuration of the main portion of the internal function of a CPU in the drawing apparatus of FIG. 7.

FIG. 8 is a diagram showing the main portion of the internal function of the CPU 120 in the present embodiment.

The CPU 120 has functions of a sub deflection astigmatic correction value Q(n+1) calculating unit 123, difference value determining unit 124 and sub deflection astigmatic coefficient calculating unit 126. In FIG. 8, a portion other than the configuration which is required for illustrating the present embodiment is omitted. Of course, the CPU 120 may have the other function required for controlling the drawing apparatus.

Further, the functions of the sub deflection astigmatic correction value Q(n+1) calculating unit 123, difference value determining unit 124 and sub deflection astigmatic coefficient calculating unit 126 are realized by software executed by the computer, but this is not limitative. For example, they can be realized by hardware by use of an electric circuit. Alternatively, they can be attained by a combination of the software and hardware configured by the electric circuit. Further, they can be attained by a combination of the hardware and firmware.

An electron beam 200 which is one example of a charged particle beam emitted from the electron gun 201 illuminates the whole portion of the first aperture 203 having a rectangular hole, for example, oblong hole by use of the illumination lens 202. Then, the electron beam 200 is formed into a rectangular shape, for example, oblong shape. The electron beam 200 of a first aperture image which has passed through the first aperture 203 is projected onto the second aperture 206 by the projection lens 204. Deflection of the position of the first aperture image on the second aperture 206 is controlled by the shaping deflector 205 so as to change the beam shape and size.

The electron beam 200 of a second aperture image which has passed through the second aperture 206 is focused by the objective lens 207 and deflected by the two deflectors (main deflector 214 and sub deflector 212) controlled by the deflection control circuit 110. Thus, the beam application position is determined while the beam follows the movement of the XY stage 105 which is continuously moved. In this case, for example, an octa-pole electrostatic deflector is used for beam deflection. The electron beam 200 can be controlled at high speed with high precision by using the octa-pole electrostatic deflector.

Figure 9:
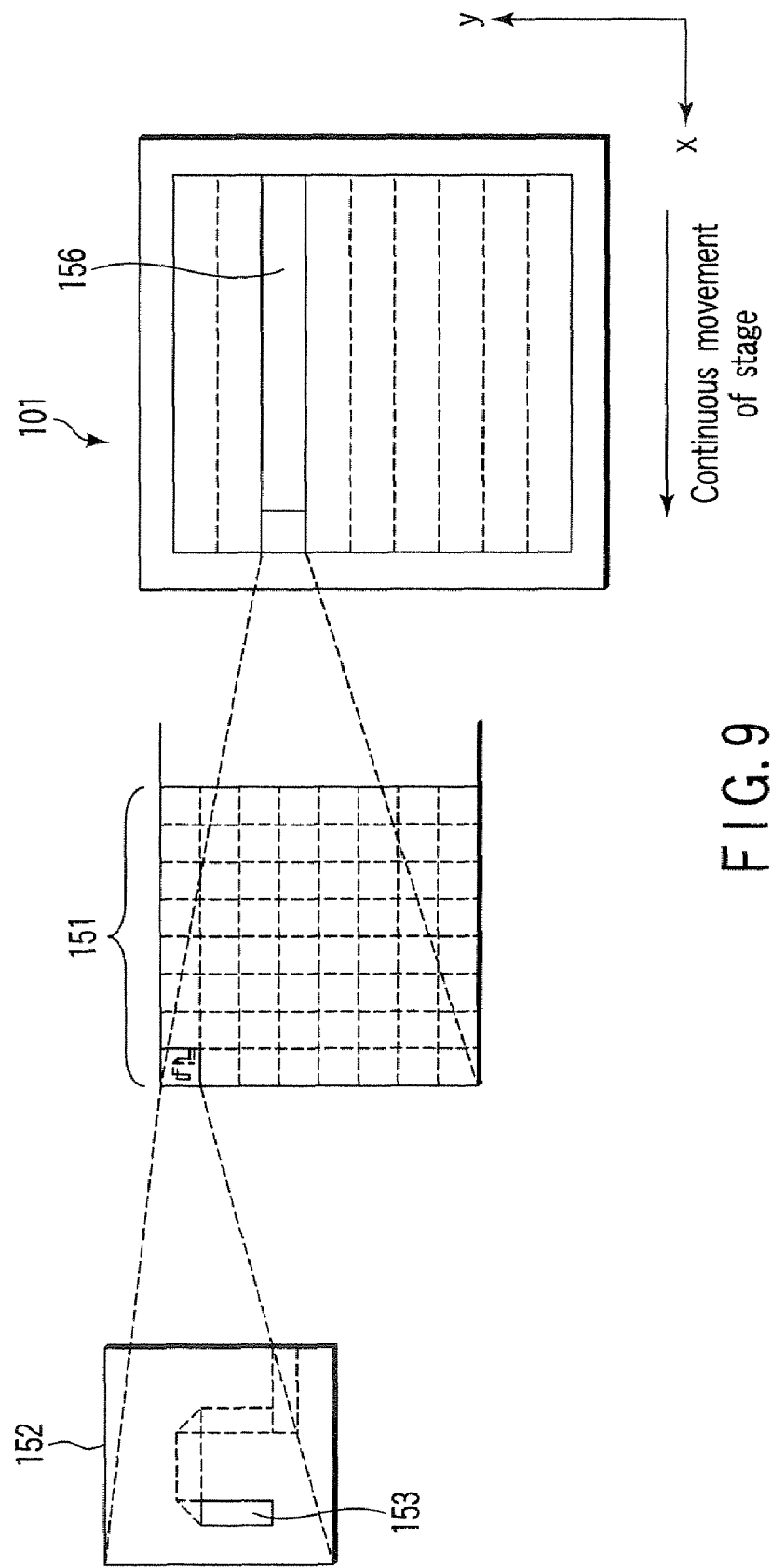
FIG. 9 is a diagram showing the relation between the main deflection region and the sub deflection regions

FIG. 9 is a diagram showing the main deflection region and sub deflection region.

As shown in FIG. 9, when a preset pattern is drawn by use of the drawing apparatus 100, for example, the drawing region of a mask used as a sample 101 is divided into a plurality of stripe-form drawing regions (stripes) 156 in the Y direction with the width in which the beam can be deflected by the main deflector 214. Each stripe 156 is divided in the X direction with the same width as that of the stripe in the Y direction. The thus divided region is used as a main deflection region 151 in which the beam can be deflected by the main deflector 214.

Each of regions obtained by further dividing the main deflection region 151 is used as a sub deflection region (sub field) 152. The sub deflection region is divided into a plurality of shot patterns 153 and each shot pattern 153 is drawn by beam application.

The sub deflector 212 is used to control the position of the electron beam 200 of each shot at high speed with high precision. Therefore, as shown in FIG. 9, the deflection range is narrow and limited in the sub field on the mask blank. Deflection of a range exceeding the above deflection range is performed by moving the position of the sub field by the main deflector 214. The main deflector 214 is used to control the position of the sub field and is moved in a range (main deflection region) in which a plurality of sub fields are contained. Further, since the XY stage 105 is continuously moved in the X direction during the drawing operation, the beam can be caused to follow the movement of the XY stage 105 by continuously moving (tracking) the drawing point of the sub field by use of the main deflector 214.

As the astigmatic points, astigmatic points on the axis of the objective lens 207, main deflection astigmatic points caused by deflection by the main deflector 214 and sub deflection astigmatic points caused by deflection by the sub deflector 212 are provided. In this example, the above astigmatic points are treated as independent phenomena and separately corrected. In the present embodiment, particularly, correction of the sub deflection astigmatic point among the above independent phenomena is explained with emphasis placed thereon. First, the astigmatic points on the axis may be statically corrected by use of an astigmatic coil (not shown). Next, the sub deflection astigmatic point is corrected after the main deflection astigmatic point caused by deflecting the electron beam 200 by the main deflector 214 is corrected. The sub deflection astigmatic correction method is explained below.

In the step S102, the calculation step of calculating a sub deflection astigmatic coefficient $R_1$ in the directions of 0° and 90° which is one example of the first inclination coefficient calculating step is performed as follows. That is, the sub deflection astigmatic coefficient $R_1$ (first inclination coefficient, one example of a preset inclination coefficient) indicating the inclination of a variation amount of the astigmatic difference when the sub deflection astigmatic correction amount S is set as a variable is calculated based on the relation between the astigmatic difference and the sub deflection astigmatic correction amount S in the directions of 0° and 90° (the first two directions). The method of deriving the sub deflection astigmatic coefficient $R_1$ of the first perpendicularly intersecting two directions (0° and 90°) is explained.

Figure 10:
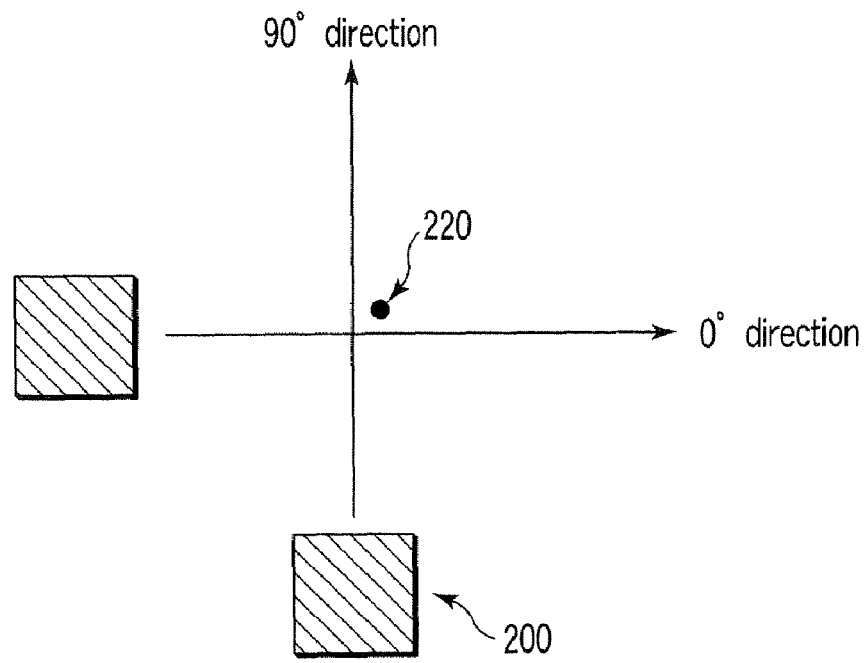
FIG. 10 is a conceptual diagram showing the scanning directions of electron beams in the directions of 0° and 90°, for illustrating the second embodiment.
Figure 11:
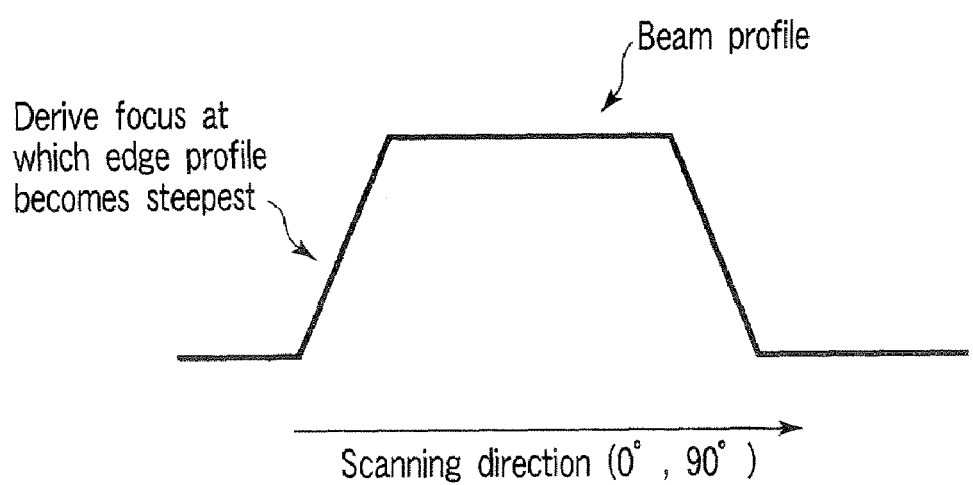
FIG. 11 is a diagram showing one example of a detection beam profile by beam scanning in the directions of 0° and 90°, for illustrating the second embodiment.

FIG. 10 is a conceptual diagram showing the scanning direction of an electron beam in the directions of 0° and 90° in the second embodiment. FIG. 11 is a diagram showing one example of a beam profile by beam of the electron beam in the directions of 0° and 90° in the second embodiment.

As shown in FIG. 10, the optimum point of focus in the perpendicularly intersecting two directions is obtained by scanning a rectangular beam 200 in the directions of 0° and 90° on a dot mark 220 of the sample surface and changing the sub deflection astigmatic correction value. That is, a reflected electron signal obtained by scanning the beam on the dot mark 220 is fetched as a beam profile and, as shown in FIG. 11, a point of focus at which the edge portion of the beam profile becomes steep is derived.

Figure 12:
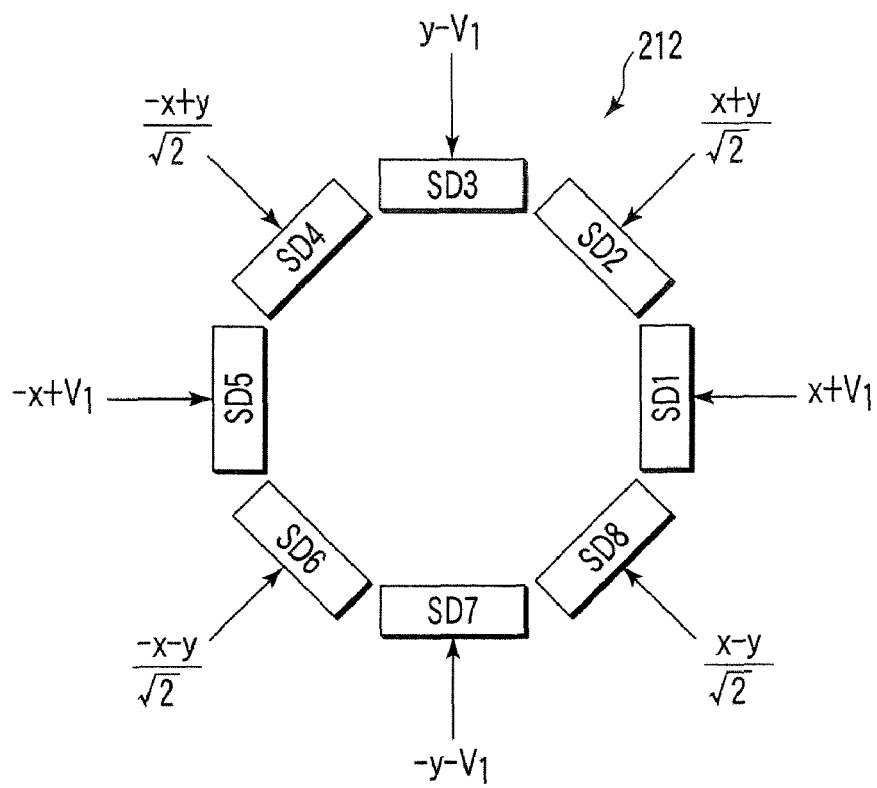
FIG. 12 is a diagram showing a state of voltages applied to respective electrodes of a sub deflector for sub deflection astigmatic correction in the directions of 0° and 90°, for illustrating the second embodiment.

FIG. 12 is a diagram for illustrating voltages applied to respective electrodes of the sub deflector for sub deflection astigmatic correction in the directions of 0° and 90° in the second embodiment. In this case, an octa-pole electrostatic deflector is used as one example. As shown in FIG. 12, for example, voltages are applied as follows to deflect the beam in a preset direction of the XY direction.

Voltage y is applied to the electrode (SD3) in the direction of 90°, voltage $(x+y)/\sqrt{2}$ is applied to the electrode (SD2) in the direction of 45°, voltage x is applied to the electrode (SD1) in the direction of 0°, voltage $(x-y)/\sqrt{2}$ is applied to the electrode (SD8) arranged in opposition to the electrode in the direction of 135°, voltage $-y$ is applied to the electrode (SD7) arranged in opposition to the electrode in the direction of 90°, voltage $(-x-y)/\sqrt{2}$ is applied to the electrode (SD6) arranged in opposition to the electrode in the direction of 45°, voltage $-x$ is applied to the electrode (SD5) arranged in opposition to the electrode in the direction of 0°, and voltage $(-x+y)/\sqrt{2}$ is applied to the electrode (SD4) in the direction of 135°.

Further, in order to adjust the sub deflection astigmatic correction amount in the directions of 0° and 90°, astigmatic voltage $V_1$ may be superimposed on deflection voltage and the value of $V_1$ may be changed. That is, in order to adjust the sub deflection astigmatic correction amount in the directions of 0° and 90°, $-V_1$ may be additionally applied to the electrodes (1) and (5) and $+V_1$ may be additionally applied to the electrodes (3) and (7).

Figure 13:
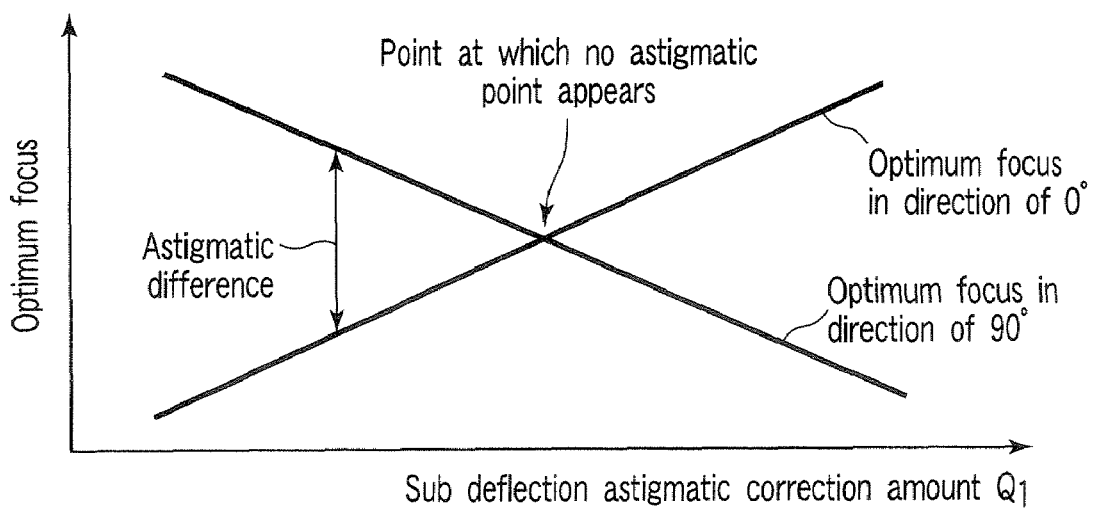
FIG. 13 is a diagram showing the relation between a sub deflection astigmatic correction amount and optimum points of focus in the directions of 0° and 90°, for illustrating the second embodiment.

FIG. 13 is a diagram showing the relation between the sub deflection astigmatic correction amount and optimum points of focus in the directions of 0° and 90° in the second embodiment. As described above, if the optimum points of focus in the perpendicularly intersecting two directions are measured while the sub deflection astigmatic correction amount is being changed, the relation between the sub deflection astigmatic correction amount $Q_1$ and the optimum points of focus as shown in FIG. 13 can be attained. A point at which the sub deflection astigmatic difference in the directions of 0° and 90° is set to "0" (at the point of intersection of the two straight lines) is used as the sub deflection astigmatic correction amount which is originally derived.

Figure 14:
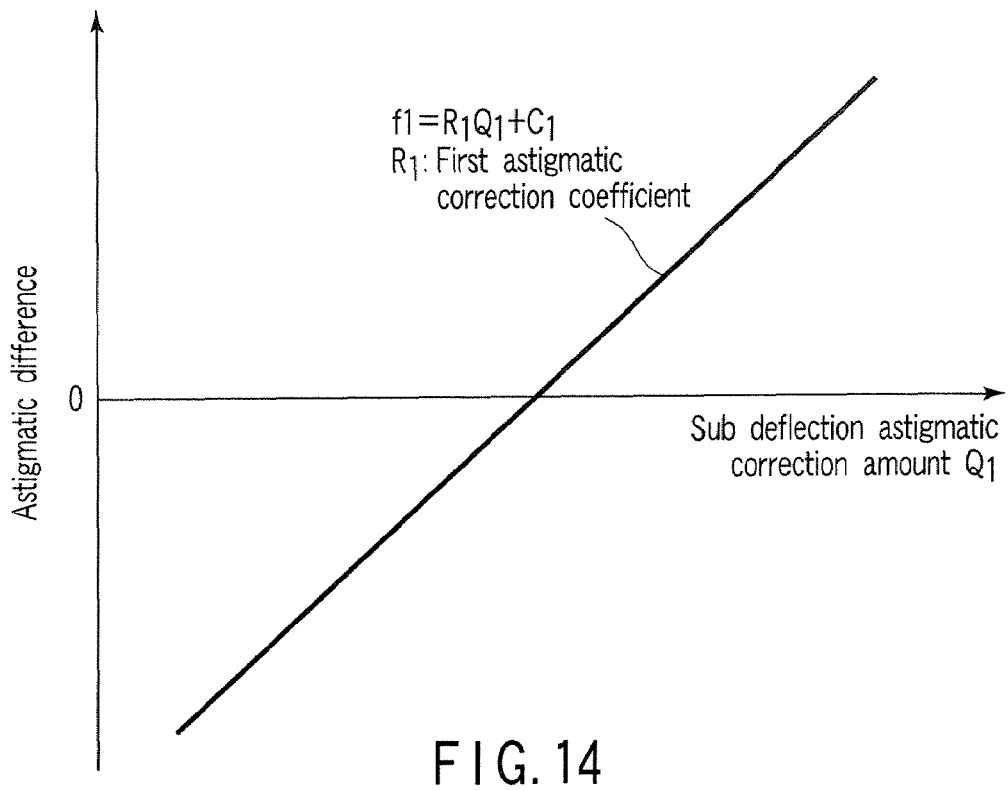
FIG. 14 is a diagram showing the relation between a sub deflection astigmatic correction amount and an astigmatic difference in the directions of 0° and 90°, for illustrating the second embodiment.

FIG. 14 is a diagram showing the relation between the sub deflection astigmatic correction amount and an astigmatic difference in the directions of 0° and 90° in the second embodiment. A graph indicating the relation between the sub deflection astigmatic correction amount $Q_1$ and the astigmatic difference as shown in FIG. 14 can be attained when plotting the sub deflection astigmatic difference shown in FIG. 13 on the ordinate axis. The inclination of the straight line of the graph is defined as a sub deflection astigmatic coefficient $R_1$.

When the beam is deflected to another position in the sub deflection field by use of the sub deflector 212, a sub deflection astigmatic coefficient $R_1$ used as a proportional constant can be used as a non-variable value even if a constant $C_1$ is changed depending on the position.

In the step S104, the calculation step of a sub deflection astigmatic coefficient $R_2$ in the directions of 45° and 135° which is one example of the second inclination calculating step is performed as follows. That is, a sub deflection astigmatic coefficient $R_2$ (one example of the second inclination coefficient) indicating the inclination of a variation amount of the astigmatic difference when a sub deflection astigmatic correction amount is used as a variable is calculated based on the relation between the astigmatic difference and the sub deflection astigmatic correction amount in the directions of 45° and 135° (second two directions). A method for deriving the sub deflection astigmatic coefficient $R_2$ in the perpendicularly intersecting two directions (in the directions of 45° and 135°) is explained below.

Figure 15:
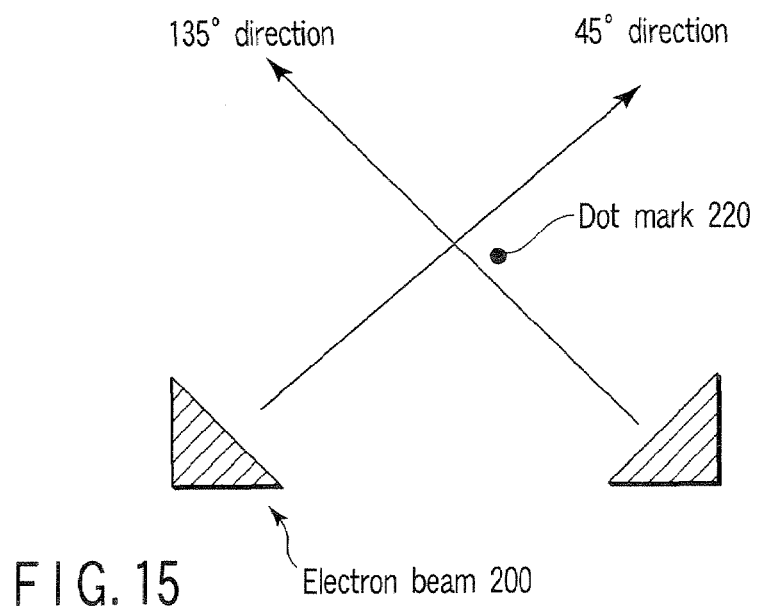
FIG. 15 is a conceptual diagram showing the scanning directions of electron beams in the directions of 45° and 135°, for illustrating the second embodiment.
Figure 16:
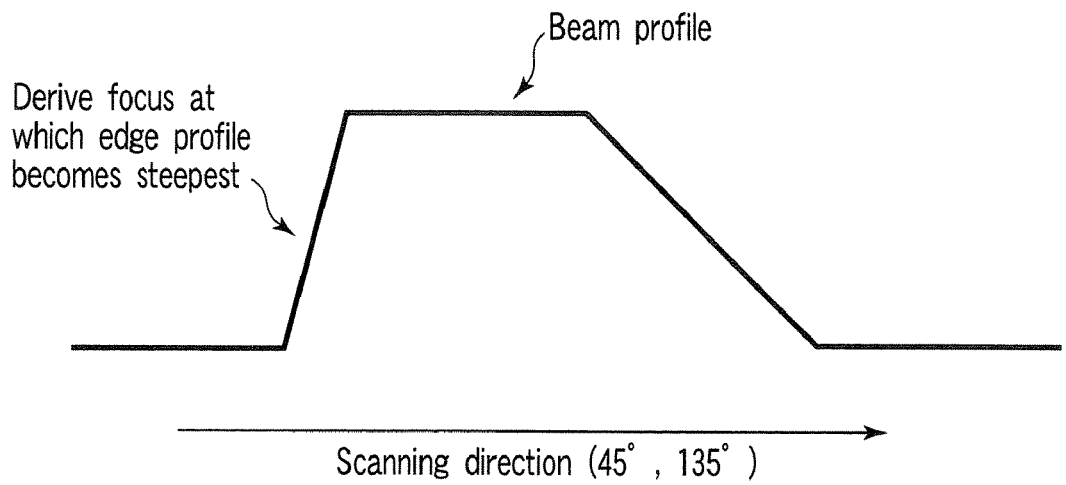
FIG. 16 is a diagram showing one example of a detection beam profile by beam scanning in the directions of 45° and 135°, for illustrating the second embodiment.

FIG. 15 is a conceptual diagram showing the scanning direction of electron beams in the directions of 45° and 135° in the second embodiment. FIG. 16 is a diagram showing one example of a detection beam profile by use of electron beams in the directions of 45° and 135° in the second embodiment.

As shown in FIG. 15, optimum points of focus in two directions which intersect at right angles are obtained by scanning two types of triangular beams 200 on a dot mark 220 of the sample surface in the directions of 45° and 135° and changing the sub deflection astigmatic correction value. That is, a reflected electron signal obtained by scanning the beam on the dot mark 220 is fetched as a beam profile and a point of focus in which the edge portion of the beam profile becomes steep is derived as shown in FIG. 16. In this example, the two types of triangular beams are used, but a highly precise beam profile can be attained by scanning a beam having an edge intersecting at right angles with respect to the scanning direction.

Figure 17:
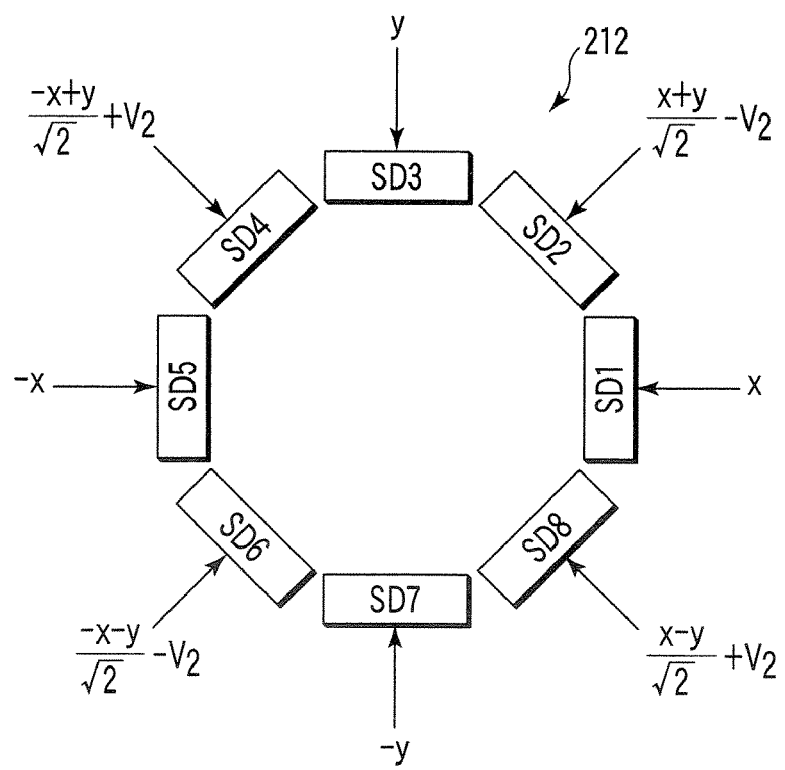
FIG. 17 is a diagram showing a state of voltages applied to respective electrodes of a sub deflector for sub deflection astigmatic correction in the directions of 45° and 135°, for illustrating the second embodiment.

FIG. 17 is a diagram showing a state of voltages applied to the respective electrodes of the sub deflector for sub deflection astigmatic correction in the directions of 45° and 135° in the second embodiment. Like the case of FIG. 12, voltages are applied as follows to deflect the beam in a preset direction of the XY direction as shown in FIG. 17.

Voltage y is applied to the electrode (SD3) in the direction of 90°, voltage $(x+y)/\sqrt{2}$ is applied to the electrode (SD2) in the direction of 45°, voltage x is applied to the electrode (SD1) in the direction of 0°, voltage $(x-y)/\sqrt{2}$ is applied to the electrode (SD8) which is arranged in opposition to the electrode in the direction of 135°, voltage $-y$ is applied to the electrode (SD7) which is arranged in opposition to the electrode in the direction of 90°, voltage $(-x-y)/\sqrt{2}$ is applied to the electrode (SD6) arranged in opposition to the electrode in the direction of 45°, voltage $-x$ is applied to the electrode (SD5) arranged in opposition to the electrode in the direction of 0°, and voltage $(-x+y)/\sqrt{2}$ is applied to the electrode (SD4) in the direction of 135°.

Further, in order to adjust the sub deflection astigmatic correction amounts in the directions of 45° and 135°, astigmatic voltage $V_2$ may be superimposed on deflection voltage and the value of $V_2$ may be changed. That is, in order to adjust the sub deflection astigmatic correction amounts in the directions of 45° and 135°, $-V_2$ may be additionally applied to the electrodes (2) and (6) and $+V_2$ may be additionally applied to the electrodes (4) and (8).

Figure 18:
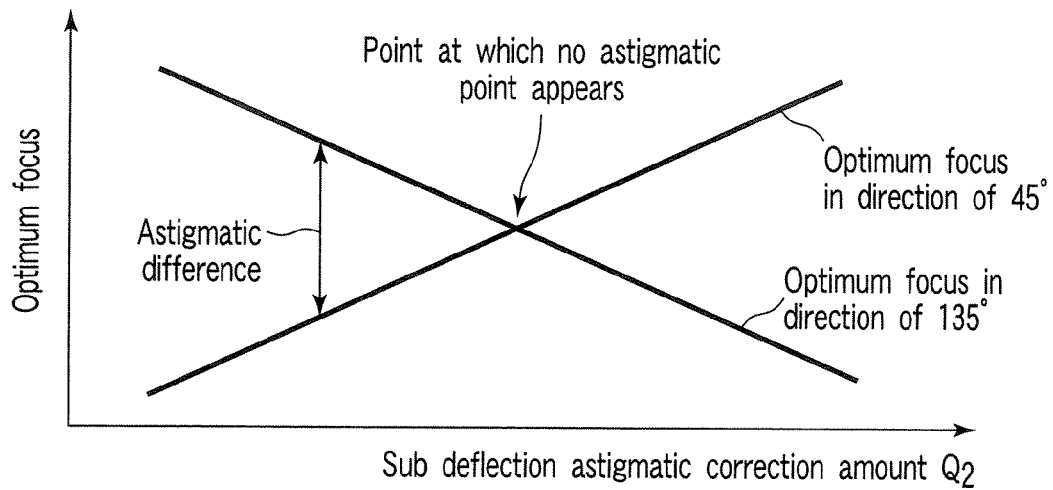
FIG. 18 is a diagram showing the relation between a sub deflection astigmatic correction amount and optimum points of focus in the directions of 45° and 135°, for illustrating the second embodiment.

FIG. 18 is a diagram showing the relation between the sub deflection astigmatic correction amount and the optimum points of focus in the directions of 45° and 135° in the second embodiment.

As described above, if the optimum points of focus in the perpendicularly intersecting two directions are measured while the sub deflection astigmatic correction value is being changed, the relation between the sub deflection astigmatic correction amount $Q_2$ and the optimum points of focus as shown in FIG. 18 can be obtained. A point at which the sub deflection astigmatic difference in the directions of 45° and 135° is set to "0" (at the point of intersection of the two straight lines) is used as the sub deflection astigmatic correction value which is originally derived.

Figure 19:
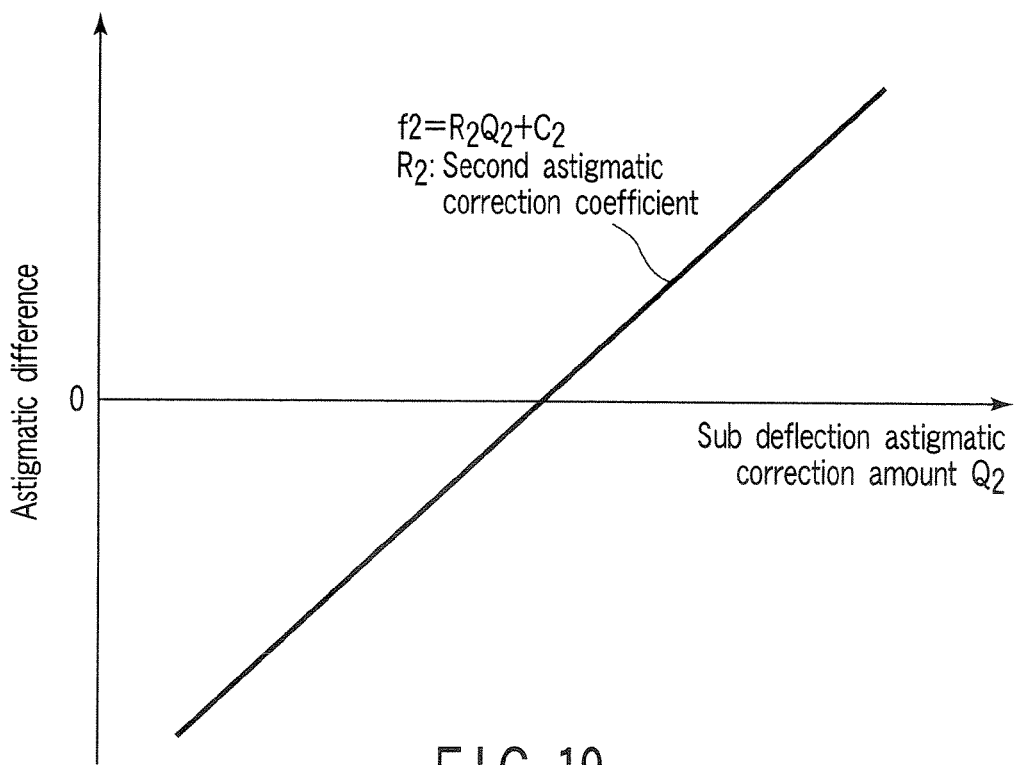
FIG. 19 is a diagram showing the relation between a sub deflection astigmatic correction amount and an astigmatic difference in the directions of 45° and 135°, for illustrating the second embodiment.

FIG. 19 is a diagram showing the relation between the sub deflection astigmatic correction amount and the astigmatic difference in the directions of 45° and 135° in the second embodiment.

A graph indicating the relation between the sub deflection astigmatic correction amount $Q_2$ and the astigmatic difference as shown in FIG. 19 can be attained when plotting the sub deflection astigmatic difference shown in FIG. 18 on the ordinate axis. The inclination of the straight line of the graph is defined as a sub deflection astigmatic coefficient $R_2$.

When the beam is deflected to another position in the sub deflection field by use of the sub deflector 212, a sub deflection astigmatic coefficient $R_2$ used as a proportional constant can be used as a non-variable value even if a constant $C_2$ is changed depending on the position.

In the step S106, the step of deflecting the electron beam 200 to a preset position in the preset main deflection region 10 by the main deflector 214 is performed as the main deflection shifting step.

In the step S108, the step of deflecting the electron beam 200 to a preset position in the preset main deflection region 10 corresponding to the main deflection shifting position by the sub deflector 212 from a state in which the electron beam 200 is shifted to the preset position in the main deflection region by the main deflector 214 is performed as the sub deflection shifting step.

As described above, if the inclinations $R_1$, $R_2$ are previously derived and the sub deflection astigmatic difference in the directions of 0° and 90° and the sub deflection astigmatic difference in the directions of 45° and 135° in the above positions are derived for each point, a sub deflection astigmatic correction amount (a point at which no astigmatic point occurs) can be derived by using the inclinations $R_1$, $R_2$. However, there occur some cases wherein the sub deflection astigmatic difference does not become "0" even if the correction is made by use of the sub deflection astigmatic correction amount at the point at which the astigmatic point thus derived does not occur. Therefore, in this example, the process of comparing the absolute values of the differences between the n-th sub deflection astigmatic correction amount and the (n+1)-th sub deflection astigmatic correction amount is performed and the sequence of repeatedly performing the above process is carried out until the difference becomes equal to or smaller than an error ($\Delta$). By using the repeating sequence, for example, an astigmatic correction amount can be derived in an extremely shorter period of time in comparison with a case wherein a graph shown in FIG. 13 or 18 is obtained based on a large number of astigmatic measurement data items and an astigmatic correction value is derived based on the graph. Next, the sub deflection astigmatic measurement routine is performed.

In the step S110, the step of setting a sub deflection astigmatic correction value $Q_1(n)$ in the directions of 0° and 90°, a sub deflection astigmatic correction value $Q_2(n)$ in the directions of 45° and 135° and a value of n is performed as the initial value setting step. First, as the initial values, 0, A1 and A2 are respectively set as n, the sub deflection astigmatic correction value $Q_1(0)$ in the directions of 0° and 90° and the sub deflection astigmatic correction value $Q_2(0)$ in the directions of 45° and 135°. If the above values are initially set, A1, A2 may be set to "0". Further, if the conventionally used values are present, the values may be used.

In the step S112, as the sub deflection astigmatic difference measurement step in the directions of 0° and 90° which is one example of the first astigmatic difference measurement step, the following process is performed. That is, the dot mark 220 (preset mark) is scanned in the directions of 0° and 90° by use of an electron beam 200 in which the sub deflection astigmatic point is corrected by use of the sub deflection astigmatic correction value $Q_1(0)$ (first sub deflection astigmatic correction value). Thus, sub deflection astigmatic differences in the directions of 0° and 90° of the electron beam 200 are measured.

Specifically, optimum points of focus in the directions of 0° and 90° are obtained by scanning the dot mark 220 of the sample surface shown in FIG. 10 by using a rectangular beam in the directions of 0° and 90° by use of the sub deflection astigmatic correction value $Q_1(0)$ That is, a reflected electron signal obtained by scanning the dot mark 220 is fetched as a beam profile and a point of focus at which the edge portion of the beam profile becomes steep as shown in FIG. 11 is derived. Then, the differences at the points of focus in the directions of 0° and 90° are measured as the sub deflection astigmatic differences obtained by use of the sub deflection astigmatic correction value $Q_1(0)$.

In the step S114, as the sub deflection astigmatic correction value $Q_1(n+1)$ calculating step which is one example of the first astigmatic correction value calculating step, the following process is performed. That is, the sub deflection astigmatic correction value $Q_1(n+1)$ calculating unit 123 calculates a sub deflection astigmatic correction value $Q_1(1)$ (in this case, which is one example of the second sub deflection astigmatic correction value) in which no sub deflection astigmatic difference occurs based on a sub deflection astigmatic correction value $Q_1(0)$, a sub deflection astigmatic difference measured by use of the sub deflection astigmatic correction value $Q_1(0)$ and a sub deflection astigmatic coefficient $R_1$.

Figure 20:
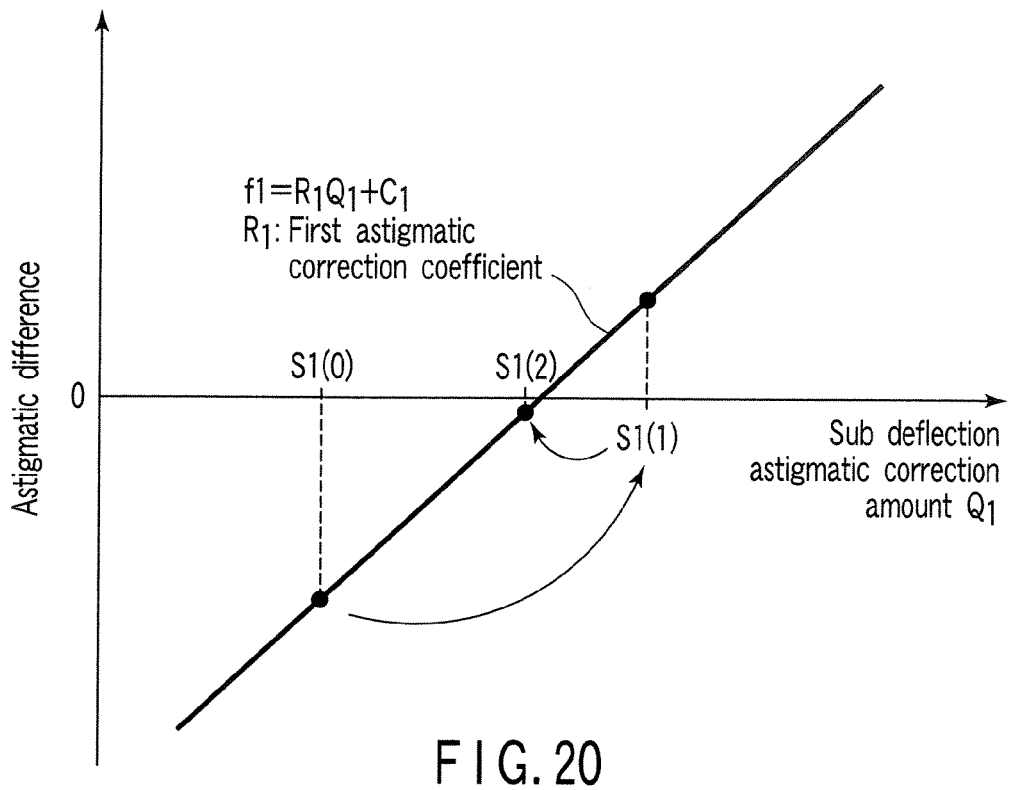
FIG. 20 is a diagram for illustrating a method for calculating a sub deflection astigmatic correction value $Q_1(n+1)$ in the second embodiment.

FIG. 20 is a diagram for illustrating a method for calculating the sub deflection astigmatic correction value $Q_1(n+1)$ in the second embodiment.

Like the graph shown in FIG. 14, the sub deflection astigmatic correction amount is plotted on the abscissa axis and the astigmatic difference is plotted on the ordinate axis as shown in FIG. 20. In this case, a sub deflection astigmatic correction value with which the value of the astigmatic difference becomes "0" can be obtained by drawing a straight line with an inclination corresponding to the sub deflection astigmatic coefficient $R_1$ with the value of the sub deflection astigmatic difference in the sub deflection astigmatic correction value $Q_1(0)$ set as a starting point. Then, the sub deflection astigmatic correction value with which the astigmatic difference becomes "0" is calculated as the sub deflection astigmatic correction value $Q_1(1)$. However, as shown in FIG. 20, even if the astigmatic point is corrected by use of the sub deflection astigmatic correction value $Q_1(1)$ with which the value of the astigmatic difference becomes "0", the value of the astigmatic difference does not become "0" in many cases if the astigmatic difference is actually measured. Therefore, the sub deflection astigmatic correction value $Q_1(n)$ is converged so as to set the value of the astigmatic difference closer to "0" as will be described later. Next, the same process is performed for the directions of 45° and 135°.

In the step S116, as the sub deflection astigmatic difference measuring step in the directions of 45° and 135° which is one example of the second astigmatic difference measuring step, the following process is performed. That is, the electron beam 200 in which the sub deflection astigmatic point is corrected with the sub deflection astigmatic correction value $Q_2(0)$ (third sub deflection astigmatic correction value) is used to scan the dot mark 220 (preset mark) in the directions of 45° and 135°. Thus, sub deflection astigmatic differences in the directions of 45° and 135° of the electron beam 200 are measured.

Specifically, optimum points of focus in the directions of 45° and 135° are obtained by scanning the dot mark 220 of the sample surface as shown in FIG. 15 by use of two types of triangular beams in the directions of 45° and 135° with the sub deflection astigmatic correction value $Q_2(0)$. That is, a reflected electron signal obtained by scanning the dot mark 220 is fetched as a beam profile and a point of focus at which the edge portion of the beam profile becomes steep as shown in FIG. 16 is derived. Then, the differences at the points of focus in the directions of 45° and 135° are measured as the sub deflection astigmatic differences obtained by use of the sub deflection astigmatic correction value $Q_2(0)$.

In the step S118, as the sub deflection astigmatic correction value $Q_1(n+1)$ calculating step which is one example of the second astigmatic correction value calculating step, the following process is performed. That is, the sub deflection astigmatic correction value $Q_1(n+1)$ calculating unit 123 calculates a sub deflection astigmatic correction value $Q_2(1)$ (in this case, which is one example of the fourth sub deflection astigmatic correction value) in which no sub deflection astigmatic difference occurs based on a sub deflection astigmatic correction value $Q_2(0)$, a sub deflection astigmatic difference measured by use of the sub deflection astigmatic correction value $Q_2(0)$ and a sub deflection astigmatic coefficient $R_2$.

Figure 21:
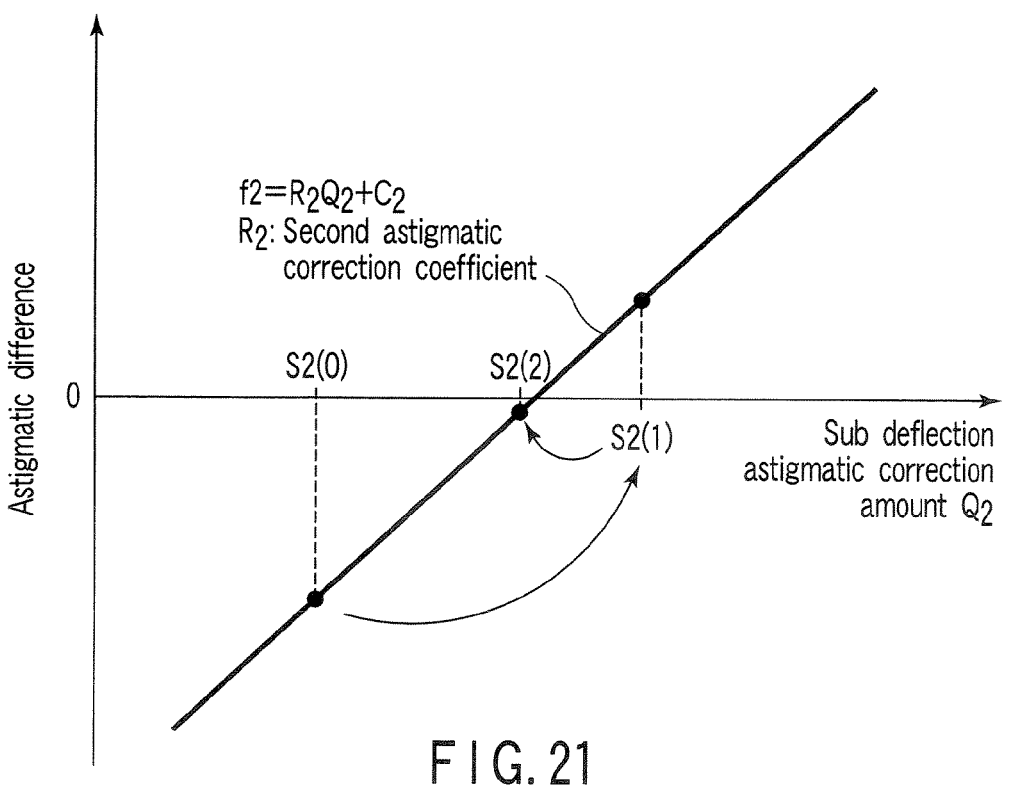
FIG. 21 is a diagram for illustrating a method for calculating a sub deflection astigmatic correction value $Q_2(n+1)$ in the second embodiment.

FIG. 21 is a diagram for illustrating a method for calculating the sub deflection astigmatic correction value $Q_2(n+1)$ in the second embodiment.

Like the graph shown in FIG. 19, the sub deflection astigmatic correction amount is plotted on the abscissa axis and the astigmatic difference is plotted on the ordinate axis as shown in FIG. 21. In this case, a sub deflection astigmatic correction value in which the value of the astigmatic difference becomes "0" can be obtained by drawing a straight line with an inclination corresponding to the sub deflection astigmatic coefficient $R_2$ with the value of the sub deflection astigmatic difference in the sub deflection astigmatic correction value $Q_2(0)$ set as a starting point. Then, the sub deflection astigmatic correction value in which the astigmatic difference becomes "0" is calculated as the sub deflection astigmatic correction value $Q_2(1)$. However, as shown in FIG. 21, even if the astigmatic point is corrected by use of the sub deflection astigmatic correction value $Q_2(1)$ in which the value of the astigmatic difference becomes "0", the value of the astigmatic difference does not become "0" in many cases if the astigmatic difference is actually measured. Therefore, the sub deflection astigmatic correction value $Q_1(n)$ is converged so as to set the value of the astigmatic difference closer to "0" as will be described later.

In the step S120, as the determination step, the step of determining whether the absolute value of the difference between the sub deflection astigmatic correction value $Q(n+1)$ and the sub deflection astigmatic correction value $Q(n)$ is smaller than a preset value $\Delta$ is performed. That is, whether the relational expression of $|Q(n+1)-Q(n)|<\Delta$ is set or not is determined.

First, as the first determination step, the difference value determining unit 124 determines whether the absolute value of the difference between the sub deflection astigmatic correction value $Q_1(1)$ and the sub deflection astigmatic correction value $Q_1(0)$ used for calculation is smaller than the preset value $\Delta$ with respect to the directions of 0° and 90°. That is, in this case, whether the relational expression of $|Q_1(1)-Q_1(0)|<\Delta$ is set or not is determined. Likewise, as the second determination step, the difference value determining unit 124 determines whether the absolute value of the difference between the sub deflection astigmatic correction value $Q_2(1)$ and the sub deflection astigmatic correction value $Q_2(0)$ used for calculation is smaller than the preset value $\Delta$ with respect to the directions of 45° and 135°. That is, in this case, whether the relational expression of $|Q_2(1)-Q_2(0)|<\Delta$ is set or not is determined. Then, if both of the above values are smaller than the preset value, the process proceeds to the step S124 and if at least one of the above values is not smaller than the preset value, the process proceeds to the step S122.

In the step S122, as the $Q(n)$ re-setting step, the sub deflection astigmatic correction amount $Q(n+1)$ is re-set into the sub deflection astigmatic correction amount $Q(n)$ when the relational expression of $|Q(n+1)-Q(n)|<\Delta$ is not set. In this example, if the relational expression of $|Q(1)-Q(0)|<\Delta$ is not set, $Q(1)$ is re-set as the sub deflection astigmatic correction amount $Q(n)$. That is, if the relational expression of $|Q_1(1)-Q_1(0)|<\Delta$ is not set with respect to the directions of 0° and 90°, $Q_1(1)$ is re-set as the sub deflection astigmatic correction amount $Q_1(n)$ (at this time, $Q_1(1)$ becomes the first sub deflection astigmatic correction value by the re-setting step). Likewise, if the relational expression of $|Q_2(1)-Q_2(0)|<\Delta$ is not set with respect to the directions of 45° and 135°, $Q_2(1)$ is re-set as the sub deflection astigmatic correction amount $Q_2(n)$ (at this time, $Q_2(1)$ becomes the third sub deflection astigmatic correction value by the re-setting step).

Then, the process of the steps S112 to S122 is repeatedly performed. Specifically, an astigmatic difference in $Q_1(1)$ is measured in the directions of 0° and 90° as shown in FIG. 20. Thus, a sub deflection astigmatic correction value $Q_1(2)$ (second sub deflection astigmatic correction value) in which the value of the astigmatic difference becomes "0" is obtained along the inclination of the sub deflection astigmatic coefficient $R_1$. After this, whether the relational expression of $|Q_1(2)-Q_1(1)|<\Delta$ is set or not is determined.

When the difference between $Q_1(2)$ and $Q_1(1)$ is not smaller than $\Delta$, the astigmatic difference in $Q_1(2)$ (at this time, $Q_1(2)$ becomes the first sub deflection astigmatic correction value by the re-setting step) is measured and a sub deflection astigmatic correction value $Q_1(3)$ (second sub deflection astigmatic correction value) in which the value of the astigmatic difference becomes "0" is obtained along the inclination of the sub deflection astigmatic coefficient $R_1$. After this, whether the relational expression of $|Q_1(3)-Q_1(2)|<\Delta$ is set or not is determined. Then, $Q_1(n+1)$ (second sub deflection astigmatic correction value) attained when the relational expression of $|Q_1(n+1)-Q_1(n)|<\Delta$ is set is obtained and used as an astigmatic correction value by performing the same process until the relational expression of $|Q_1(n+1)-Q_1(n)|<\Delta$ is set.

Then, an astigmatic difference in $Q_2(1)$ is measured in the directions of 45° and 135° as shown in FIG. 16 and a sub deflection astigmatic correction value $Q_2(2)$ (fourth sub deflection astigmatic correction value) in which the value of the astigmatic difference becomes "0" is obtained along the inclination of the sub deflection astigmatic coefficient $R_2$. After this, whether the relational expression of $|Q_2(2)-Q_2(1)|<\Delta$ is set or not is determined.

When the difference between $Q_2(2)$ and $Q_2(1)$ is not smaller than $\Delta$, the astigmatic difference in $Q_2(2)$ (at this time, $Q_2(2)$ becomes the third sub deflection astigmatic correction value by the re-setting step) is measured and a sub deflection astigmatic correction value $Q_2(3)$ (fourth sub deflection astigmatic correction value) in which the value of the astigmatic difference becomes "0" is obtained along the inclination of the sub deflection astigmatic coefficient $R_2$. After this, whether the relational expression of $|Q_2(3)-Q_2(2)|<\Delta$ is set or not is determined. Then, $Q_2(n+1)$ (fourth sub deflection astigmatic correction value) attained when the relational expression of $|Q_2(n+1)-Q_2(n)|<\Delta$ is set is obtained and used as an astigmatic correction value by performing the same process until the relational expression of $|Q_2(n+1)-Q_2(n)|<\Delta$ is set.

Thus, the correction value is converged to a point with preset precision at which no astigmatic point occurs. $Q(n+1)$ finally obtained is stored in the memory 122 together with deflection shifting information such as a main deflection shifting position and sub deflection shifting position.

As described above, a sub deflection astigmatic correction value $Q_1(n+1)$ attained when the absolute value of the difference in the directions of 0° and 90° becomes smaller than the value $\Delta$ and a sub deflection astigmatic correction value $Q_2(n+1)$ attained when the absolute value of the difference in the directions of 45° and 135° becomes smaller than the value $\Delta$ can be obtained at one point (position) in a certain sub deflection field in a certain main deflection field. Then, a sub deflection astigmatic correction value $Q_1(n+1)$ attained when the absolute value of the difference in the directions of 0° and 90° becomes smaller than the value $\Delta$ and a sub deflection astigmatic correction value $Q_2(n+1)$ attained when the absolute value of the difference in the directions of 45° and 135° becomes smaller than the value $\Delta$ are derived in a next position in a certain sub deflection field in a certain main deflection field.

In the step S124, as the distribution measurement end determining step in the sub deflection field, whether or not the distribution measurements in all of the sub deflection shifting positions in the sub deflection field are completed, in other words, whether or not the process of the steps S110 to S122 is completed is determined. If the process is not yet completed, the process returns to the step S108 to shift the sub deflection shifting position and perform the process of the steps S110 to S122 in a next sub deflection shifting position. Thus, the process of the steps S110 to S122 is repeatedly performed in all of the sub deflection shifting positions in a preset main deflection shifting position.

Figure 22:
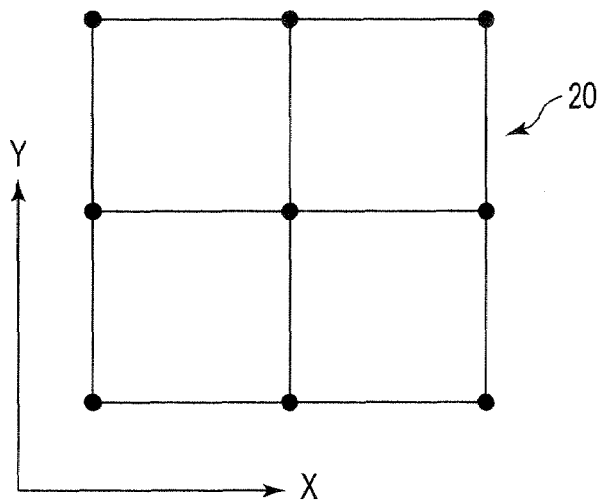
FIG. 22 is a diagram for illustrating a sub deflection shifting method in the second embodiment.

FIG. 22 is a diagram for illustrating a sub deflection shifting method in the second embodiment.

As shown in FIG. 22, in this example, the sub deflection region is divided into nine portions of 3×3 in total, sub deflection astigmatic points are measured in the respective positions and correction amounts thereof are derived. Specifically, the main deflection position is fixed and the dot mark 220 is moved by moving the XY stage 105 so as to relatively shift the sub deflection position. Thus, sub deflection astigmatic points at the respective points (in the respective sub deflection shifting positions) are measured. Then, as described above, a sub deflection astigmatic correction value $Q_1(n+1)$ set when the absolute value of the difference in the directions of 0° and 90° becomes smaller than the value $\Delta$ and a sub deflection astigmatic correction value $Q_2(n+1)$ set when the absolute value of the difference in the directions of 45° and 135° becomes smaller than the value $\Delta$ are obtained.

In the step S126, as the distribution measurement end determining step in the main deflection field, whether or not the distribution measurements in all of the main deflection shifting positions in the main deflection field are completed, in other words, whether or not the process of the steps S108 to S124 is completed is determined. If the process is not yet completed, the process returns to the step S106 to shift the main deflection shifting position and perform the process of the steps S108 to S124 in a next main deflection shifting position. Thus, the process of the steps S108 to S124 is repeatedly performed in all of the main deflection shifting positions 12 in the preset main deflection field.

Figure 23:
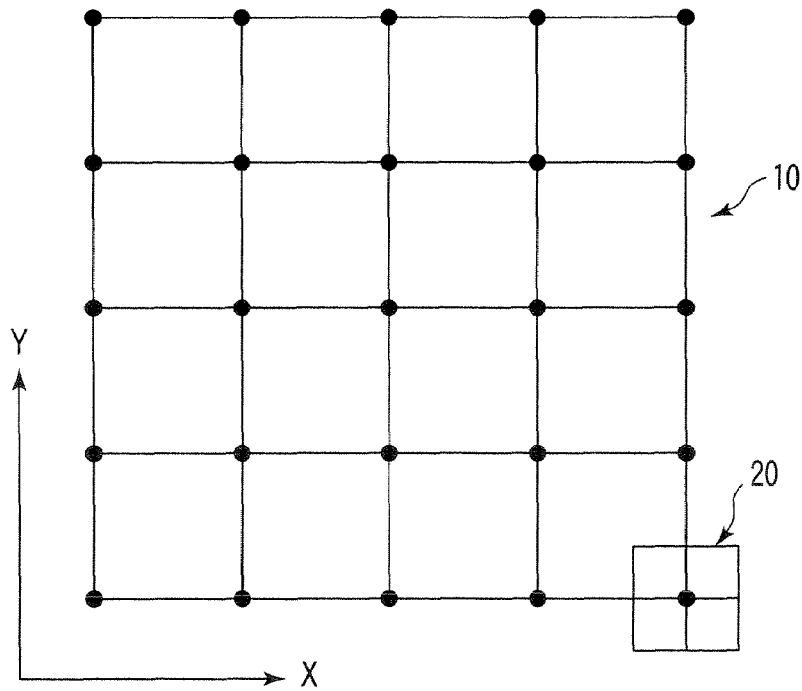
FIG. 23 is a diagram for illustrating a main deflection shifting method in the second embodiment.

FIG. 23 is a diagram for illustrating a main deflection shifting method in the second embodiment.

The sub deflection astigmatic point has a property of varying depending on the main deflection position. Therefore, as shown in FIG. 23, the main deflection region is divided into 25 portions of 5×5 in total and sub deflection astigmatic points are measured in the respective positions. Specifically, sub deflection astigmatic point distributions of 3×3 points are measured in the 25 portions of the main deflection field. Thus, sub deflection astigmatic correction amount distributions of nine portions of 3×3 points are derived in the 25 portions of the main deflection field.

In the step S128, as the sub deflection astigmatic correction coefficient calculating step which is one example of the astigmatic coefficient calculating step, the following process is performed. That is, the sub deflection astigmatic coefficient calculating unit 126 which is one example of the astigmatic coefficient calculating unit calculates a coefficient (sub deflection astigmatic correction coefficient) in the relational equation which defines the sub deflection astigmatic correction amount $Q_1$ in each position of the drawing region by use of a sub deflection astigmatic correction value $Q_1(n+1)$ obtained when the absolute value of the difference between values in the directions of 0° and 90° calculated in each position becomes smaller than the value $\Delta$. Likewise, it calculates a coefficient (sub deflection astigmatic correction coefficient) in the relational equation which defines the sub deflection astigmatic correction amount $Q_2$ in each position of the drawing region by use of a sub deflection astigmatic correction value $Q_2(n+1)$ obtained when the absolute value of the difference between values in the directions of 45° and 135° becomes smaller than the value $\Delta$.

The relational equations which define the sub deflection astigmatic correction amounts $Q_1$ and $Q_2$ in the second embodiment are as follows.

$$Q_1(x, y) = S1x + S2y + S3$$

$$Q_2(x, y) = T1x + T2y + T3$$

where (x, y) indicates the sub deflection position.

The sub deflection astigmatic correction amount distribution of nine portions of 3×3 in total in the sub deflection region fixed in the main deflection shifting position in which the main deflection position lies is subjected to a fitting process by use of a linear equation (relational equation) which uses the coordinate (x, y) indicating the sub deflection position as indicated in the above equation as a variable. Then, coefficients $S_1$, $S_2$ and $S_3$ of the sub deflection astigmatic correction amount $Q_1(x, y)$ which becomes the relational equation in the directions of 0° and 90° and coefficients $T_1$, $T_2$ and $T_3$ of the sub deflection astigmatic correction amount $Q_2(x, y)$ which becomes the relational equation in the directions of 45° and 135° are calculated. Likewise, six coefficients ($S_1$, $S_2$, $S_3$, $T_1$, $T_2$, $T_3$) used as sub deflection astigmatic correction coefficients in 25 positions in the main deflection field are derived.

$$S1 = a_0 + a_1 X + a_2 Y + a_3 X^2 + a_4 XY + a_5 Y^2 + a_6 X^3 + a_7 X^2 Y + a_8 XY^2 + a_9 Y^3$$

$$S2 = b_0 + b_1 X + b_2 Y + b_3 X^2 + b_4 XY + b_5 Y^2 + b_6 X^3 + b_7 X^2 Y + b_8 XY^2 + b_9 Y^3$$

$$S3 = c_0 + c_1 X + c_2 Y + c_3 X^2 + c_4 XY + c_5 Y^2 + c_6 X^3 + c_7 X^2 Y + c_8 XY^2 + c_9 Y^3$$

$$T1 = d_0 + d_1 X + d_2 Y + d_3 X^2 + d_4 XY + d_5 Y^2 + d_6 X^3 + d_7 X^2 Y + d_8 XY^2 + d_9 Y^3$$

-continued $$T2 = e_0 + e_1 X + e_2 Y + e_3 X^2 + e_4 XY + e_5 Y^2 +$$
$$e_6 X^3 + e_7 X^2 Y + e_8 XY^2 + e_9 Y^3$$

$$T3 = f_0 + f_1 X + f_2 Y + f_3 X^2 + f_4 XY + f_5 Y^2 +$$
$$f_6 X^3 + f_7 X^2 Y + f_8 XY^2 + f_9 Y^3$$

where (X, Y) indicates the main deflection position.

The coefficients $S_1$, $S_2$ and $S_3$ (sub deflection astigmatic correction coefficients in the directions of 0° and 90°) and coefficients $T_1$, $T_2$ and $T_3$ (sub deflection astigmatic correction coefficients in the directions of 45° and 135°) in the above 25 positions are subjected to a fitting process by use of a cubic function having the coordinate (X, Y) indicating the main deflection position as a variable by using the least squares method as described above. The sub deflection astigmatic point has a property of varying depending on the main deflection position. Therefore, when the sub deflection astigmatic point is set as a function of the main deflection position and if the sub deflection position is positioned in a desired position, a sub deflection astigmatic correction coefficient in the position can be attained. As a result, the sub deflection astigmatic point can be corrected with high precision.

Further, although not shown in FIG. 6, the sub deflection astigmatic correction coefficients $S_1$, $S_2$, $S_3$, $T_1$, $T_2$ and $T_3$ dependent on the main deflection position in each position of the whole drawing region can be obtained by performing the above steps for all of the main deflection fields.

Then, the thus obtained sub deflection astigmatic correction coefficients $S_1$, $S_2$, $S_3$, $T_1$, $T_2$ and $T_3$ are stored in the memory 122 together with deflection shifting position information relating to positions of the main deflection field. The sub deflection astigmatic correction coefficients $S_1$, $S_2$, $S_3$, $T_1$, $T_2$ and $T_3$ are set as parameters for sub deflection astigmatic correction in the sub deflection astigmatic correction circuit 114.

The equations indicating the relations between the sub deflection astigmatic correction amount Q and the correction voltage V are as follows.

$$Q_1 = k_1 \cdot V_1$$

$$Q_2 = k_2 \cdot V_2$$

The correction voltage $V_1$ and the sub deflection astigmatic correction amount $Q_1$ in the two directions of 0° and 90° can be defined by $Q_1 = k_1 \cdot V_1$ as shown in the above equation by use of a preset coefficient $k_1$. That is, $Q_1$ varies in proportion to $V_1$. Likewise, the correction voltage $V_2$ and the sub deflection astigmatic correction amount $Q_2$ in the two directions of 45° and 135° can be defined by $Q_2 = k_2 \cdot V_2$ as shown in the above equation by use of a preset coefficient $k_2$. That is, $Q_2$ varies in proportion to $V_2$.

Correction voltages $V_1$ and $V_2$ in corresponding positions are derived based on the sub deflection astigmatic correction amount $Q_1$ in the two directions of 0° and 90° and the sub deflection astigmatic correction amount $Q_2$ in the two directions of 45° and 135° defined as functions of the main deflection position (X, Y) and sub deflection position (x, y). Then, the sub deflection astigmatic point can be corrected by correcting voltages applied to the respective electrodes of the sub deflector 212 of the electrostatic deflector by using the correction voltages $V_1$ and $V_2$ in the corresponding positions.

Figure 24A:
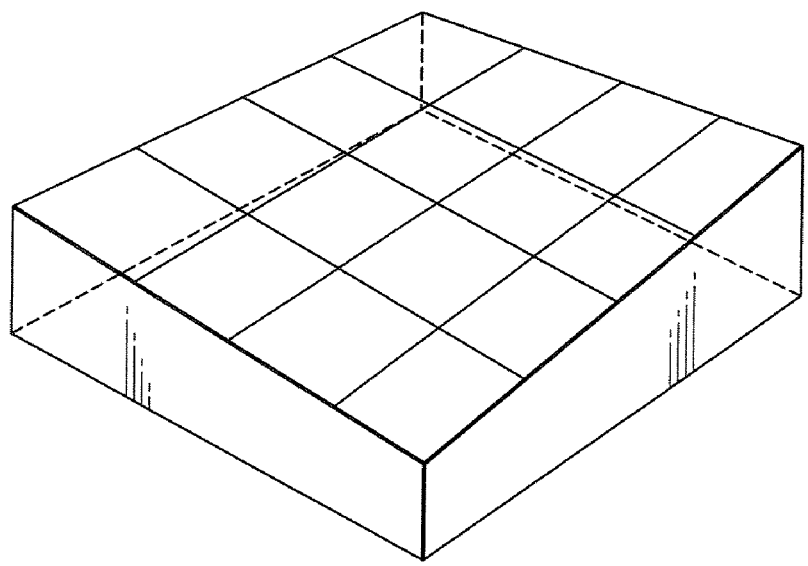
FIGS. 24A, 24B are views showing the focus distribution of beam edges in the 0° direction, for illustrating the second embodiment.
Figure 24B:
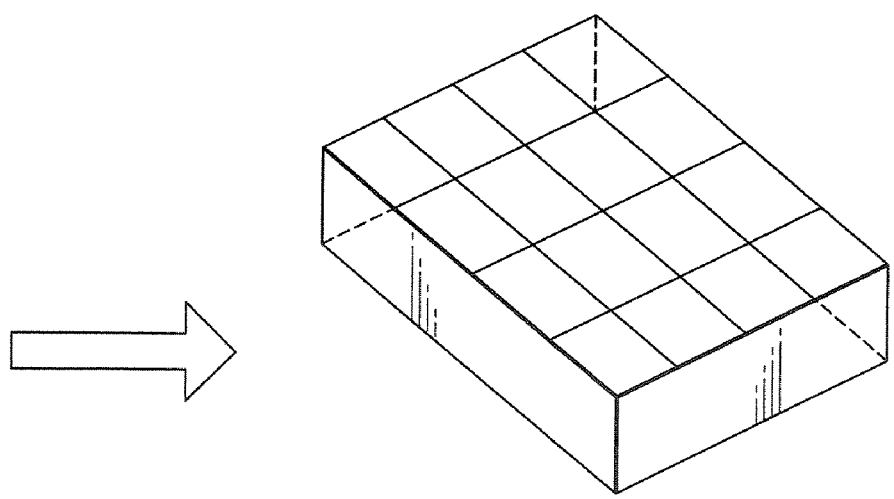
Figure 25A:
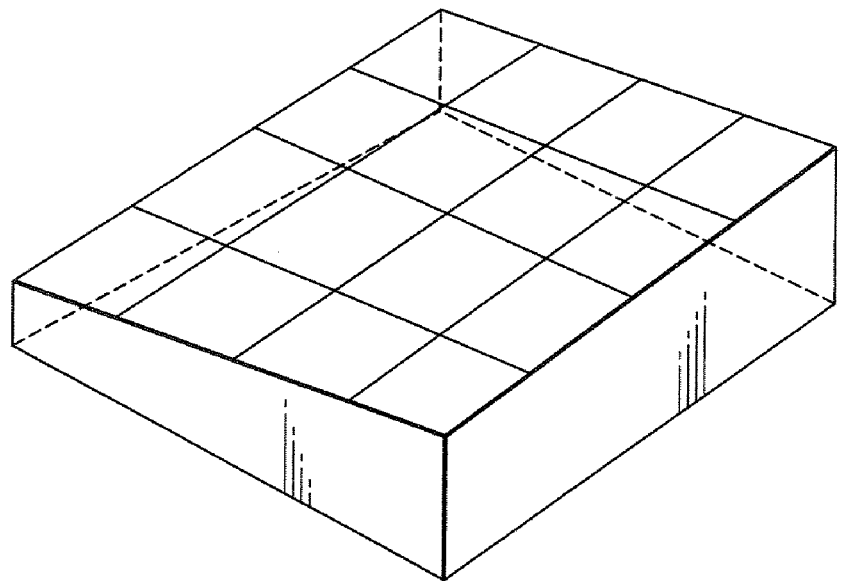
FIGS. 25A, 25B are views showing the focus distribution of beam edges in the 90° direction, for illustrating the second embodiment.
Figure 25B:
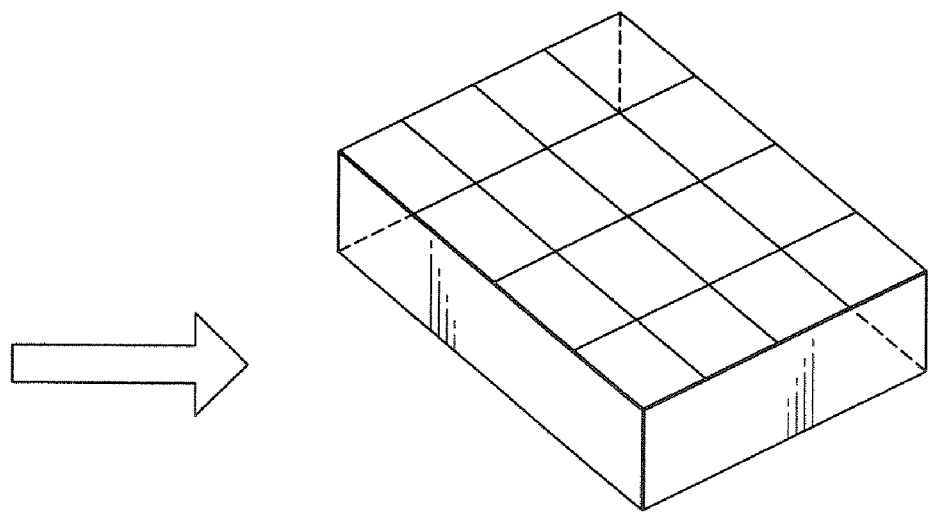

FIGS. 24A, 24B and FIGS. 25A and 25B are conceptual views for illustrating the fact that the astigmatic point distribution in the sub deflection region is measured in each main deflection region and corrected by the deflection control circuit 110 which is a correction mechanism and occurrence of the deflection astigmatic point distribution is suppressed in the second embodiment. FIGS. 24A and 24B show the focus deviation distributions of edges in the 0° direction of the beam and FIGS. 25A, 25B show the focus deviation distribution of edges in the 90° direction of the beam. The difference between the above distributions appears as a deflection astigmatic point.

The deflection astigmatic point distribution occurs in the small sub deflection region depending on the mechanical manufacturing precision of the sub deflector 212. Since focus deviation occurs in the two perpendicularly intersecting directions (for example, 0° and 90° directions) according to the deflection amount of the sub deflector 212, the distribution appears as a deflection astigmatic point distribution. As shown in FIG. 24A, astigmatic point distributions appear in the sub deflection regions and the distribution varies according to the main deflection position. Therefore, the mechanism which calculates the sub deflection astigmatic correction amount $Q_1$ in a desired main deflection position (X, Y) and desired sub deflection position (x, y) on the real-time basis is realized by use of the deflection control circuit 110. Voltages are applied to the respective electrodes of the sub deflector 212 of the electrostatic deflector shown in FIG. 12 by outputting the astigmatic correction voltage $V_1$ based on the relational equations of $S_1$, $S_2$, $S_3$ and $T_1$, $T_2$, $T_3$. Thus, as shown in FIG. 24B, the focus distributions in the respective directions (0° and 90° directions) can be reduced and occurrence of the deflection astigmatic points can be suppressed.

This also applies to astigmatic points caused by focus deviation in the directions of 45° and 135° as shown in FIGS. 25A and 25B. That is, occurrence of astigmatic point distribution caused by focus deviation in the respective directions can be suppressed by deriving an astigmatic correction amount $Q_2$ and outputting astigmatic correction voltage $V_2$.

In the step S130, as the drawing step, the drawing apparatus 100 corrects astigmatic points in the two directions of 0° and 90° of the electron beam 200 by use of the sub deflection astigmatic correction coefficients $S_1$, $S_2$, $S_3$ (which are one example of the coefficients) of the relational equations which define the calculated sub deflection astigmatic correction amounts. Further, it corrects astigmatic points in the two directions of 45° and 135° of the electron beam 200 by use of the sub deflection astigmatic correction coefficients $T_1$, $T_2$, $T_3$ (which are one example of the coefficients). Then, a preset pattern is drawn on the sample by the drawing unit 150 by using the thus corrected electron beam 200.

Specifically, the sub deflection astigmatic correction circuit 114 in which the sub deflection astigmatic correction coefficients $S_1$, $S_2$, $S_3$, $T_1$, $T_2$, $T_3$ are set as parameters inputs the position of the XY stage 105 from the laser length measuring machine 160 and calculates correction voltages $V_1$ and $V_2$ on the real-time basis for each shot according to the deflection position by use of a high-speed operation circuit. Then, the original deflection voltages calculated in the sub deflection control circuit 112 are corrected as voltages applied to the respective electrodes by use of the correction voltages $V_1$ and $V_2$ in the sub relay box 132. The thus corrected application voltages are applied to the sub deflector 212 via the DAC 142. Also, original deflection voltages calculated in the main deflection control circuit 116 are applied to the main deflector 214 via the main relay box 134 and DAC 144. In this example, correction of the main deflection astigmatic point is not shown in the drawing and the explanation thereof is omitted. The electron beam 200 in which the astigmatic point is corrected is focused by the objective lens 207 and applied to the sample to draw a preset pattern on the sample.

As described above, in the second embodiment, the sub deflection astigmatic correction process is performed by the sub deflection astigmatic correction circuit 114 or the like configured by the high-speed operation circuit. When calculating sub deflection astigmatic coefficients used in the sub deflection astigmatic correction process, sub deflection astigmatic coefficients $R_1$ and $R_2$ are previously derived and a final astigmatic correction amount $Q(n+1)$ is derived based on the thus calculated coefficients and an astigmatic correction amount $Q(0)$ at a desired point in order to converge $Q_1(n)$ and $Q_2(n)$. As a result, the process can be completed by performing the focusing operation n times.

On the other hand, if sub deflection astigmatic correction amounts are adequately changed and the focusing adjustment of the objective lens is made in the respective states, the number of beam scanning operations corresponding to the focusing adjustment operations of (n×t) times is required if the number of times of beam scanning operations performed until the correction amounts are converged is n and the number of searching points for variation in correction amounts is set to t. Thus, in comparison with the above case, in the present embodiment, the number of focusing operations or the number of measuring points can be reduced. Therefore, an astigmatic correction amount can be derived by use of a less number of beam scanning operations. As a result, the high-speed operation can be attained.

Further, in the above method, the astigmatic correction amount Q at the point of intersection is used again as a next astigmatic correction amount $Q(n)$ for the $(n+1)$-th measuring process, but the method is not limited to this case. For example, it is preferable to recursively use a value obtained by adding $\Delta Q(n+1)=k|Q(n)-Q(n-1)|$ (k is a constant smaller than 1.0) as a variation amount for $(n+1)$-th measurement. Thus, the deterioration in the convergence due to an error caused by reducing the number of measurement points can be suppressed and the convergence can be enhanced.

In the main deflection astigmatic correction process, an astigmatic point measurement is made in the position of the sub deflection center in which no sub deflection astigmatic point is present and coefficients of a cubic polynomial are calculated. Then, the main deflection astigmatic correction process which is the same as the sub deflection astigmatic correction process can be performed by use of a main deflection astigmatic correction circuit (not shown).

As described above, in the present embodiment, the drawing process in which the sub deflection astigmatic point is corrected can be performed and the CD precision with higher precision can be attained. Further, the number of measurements can be more reduced by using a preset inclination coefficient in comparison with a case wherein the astigmatic correction amount is adequately changed and converged. Thus, the number of operations can be reduced.

Third Embodiment

In the third embodiment, a method performed before performing the sub deflection astigmatic correction process by use of the method of the second embodiment and after the number of sub deflection astigmatic points is reduced by use of a method explained below is explained.

Figure 26:
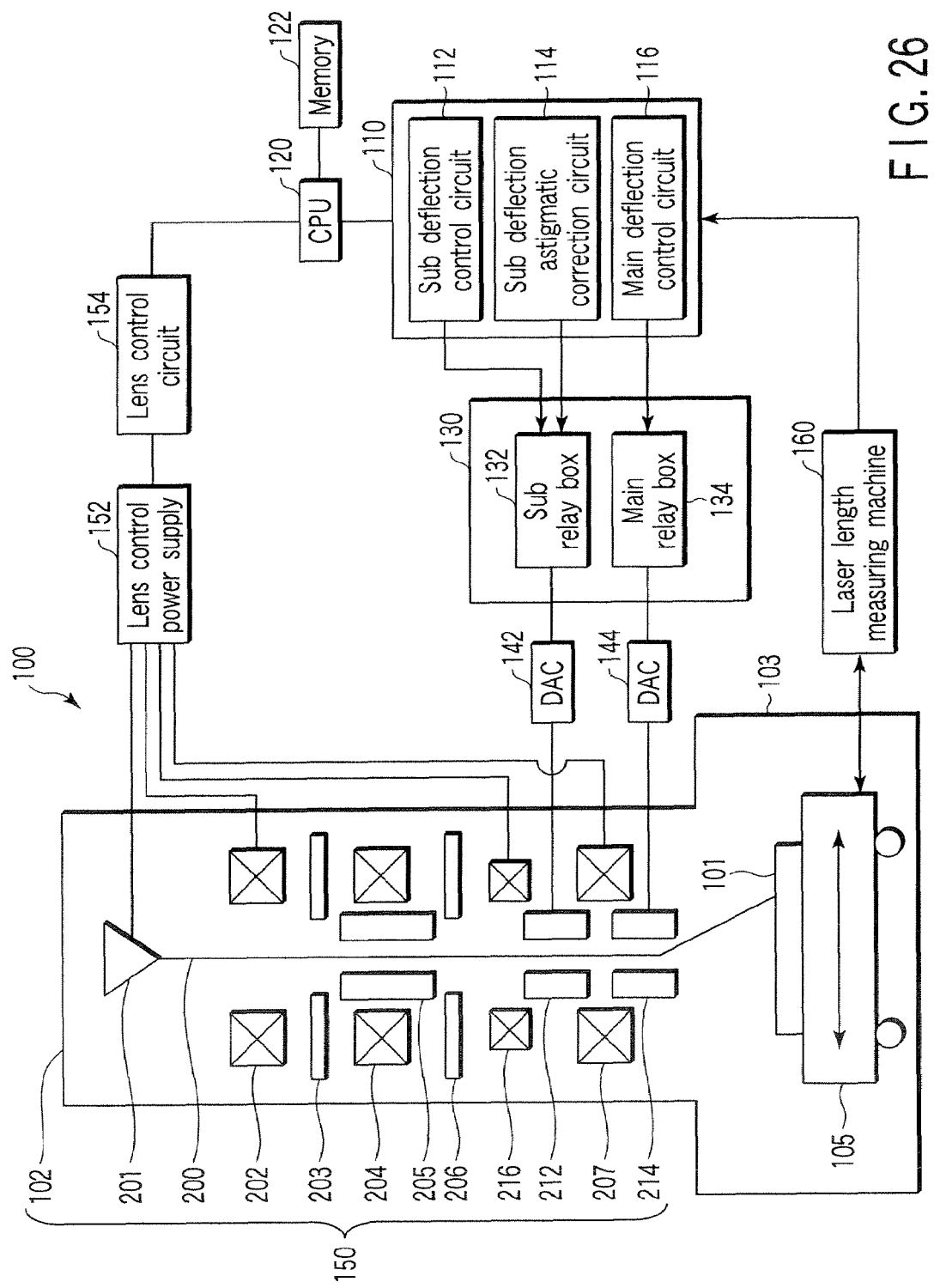
FIG. 26 is a conceptual diagram showing the configuration of an electron beam drawing apparatus according to a third embodiment of this invention.

FIG. 26 is a conceptual diagram showing the configuration of a drawing apparatus according to the third embodiment of this invention. In FIG. 26, portions which are the same as those of FIG. 7 are denoted by the same reference symbols and the detail explanation thereof is omitted.

The apparatus of the present embodiment is the same as that of FIG. 7 except that it includes an alignment coil 216 in addition to the configuration of FIG. 7. The alignment coil 216 is controlled by passing a desired exciting current therethrough from a lens control power supply 152 controlled by a lens control circuit 154. Further, in FIG. 26, description of portions other than the configuration required for explaining the present embodiment is omitted. Of course, a drawing apparatus 100 normally contains the other necessary configuration. Since the third embodiment is the same as the second embodiment except that the alignment coil 216 is additionally provided and an electron beam 200 is controlled by the alignment coil 216, the explanation of the portions other than different portions is omitted.

In the third embodiment, first, occurrence of sub deflection astigmatic points is suppressed in the beam parallel movement step. As the beam parallel movement step, the alignment coil 216 is driven to move in parallel (in a direction perpendicular to the beam axis direction) the orbit of the beam in a sub deflector 212. Then, as the focus deviation measurement step, a focus deviation in the sub deflection field is measured by deflecting the beam by use of the sub deflector 212 in a state in which the orbit of the beam in the sub deflector 212 is moved in parallel. Further, an in-plane focus inclination is calculated.

As is explained with reference to FIGS. 24A, 24B and FIGS. 25A, 25B, a certain inclination occurs in the focus position distribution even in the small sub deflection region depending on the mechanical manufacturing precision of the deflector. Since a certain inclination occurs in the focused position according to the deflection amount of the sub deflector 212 and a focus deviation occurs in the X and Y directions, deflection astigmatic points appear. When an attention is paid to a certain region, the focused position is deviated in a preset direction in each of a plurality of sub deflection regions positioned in the above certain region as shown in FIGS. 24A and 25A. That is, a certain inclination (focus inclination) tends to occur in the focused position distribution.

Therefore, the electron beam 200 is moved in parallel in the xy directions perpendicular to the beam axis direction (z-axis direction) of the electron beam 200 by passing a preset current through the alignment coil 216 from the lens control power supply 152 controlled by the lens control circuit 154. The focus inclination can be reduced as shown in FIGS. 24B and 25B by moving the electron beam 200 in parallel in the perpendicularly intersecting directions XY.

The current amount passing through the alignment coil 216 is controlled to reduce the focus deviation amount of the electron beam 200 deflected by the sub deflector 212 in the field of the sub deflection region of the sample surface. Specifically, the focus deviation in the sub deflection field is divided into the focus deviations in the x and y directions and linear coefficients of the focus inclination in the sub deflection field are derived. Then, the coefficients and two-dimensional excitation value are expressed in a function form and an excitation value of the alignment coil 216 which makes the absolute values of the coefficients minimum is derived. A current corresponding to the thus derived excitation value is passed through the alignment coil 216. As a result, the focus deviation amount in the sub deflection field can be made minimum. In other words, the distribution of the focused positions can be set closer to the flat distribution. That is, the focus deviation amount can be reduced.

In FIG. 26, the alignment coil 216 is arranged in the upper position of the sub deflector 212, but the arrangement is not limited to this case. The arrangement position of the alignment coil 216 can be set in any position in which the orbit of the electron beam 200 passing through the sub deflector 212 can be changed by the sub deflector 212 (position which can be deflected by the sub deflector 212). More preferably, for example, the alignment coil 216 may be set in substantially the same height position (in the z direction) as that of the sub deflector 212. Alternatively, it can be set in the slightly higher position of the sub deflector 212.

As described above, the sub deflection astigmatic correction coefficients $S_1$, $S_2$, $S_3$, $T_1$, $T_2$, $T_3$ are derived by the method explained in the second embodiment after the focus deviation amount in the sub deflection field is reduced. Thus, the sub deflection astigmatic correction amount can be further reduced by sequentially performing the two types of methods.

In the above explanation, the processing contents or operation contents of "-unit" or "-step" can be attained by a program which can be executed by a computer. Alternatively, they can be attained not only by a program used as software but also by a combination of hardware and software. Further, they can be attained by a combination of software and firmware. If the program is used, the program is recorded on a recording medium such as a magnetic disk device, magnetic tape device, FD, ROM (Read Only Memory) (not shown) or the like. For example, the program is recorded in the memory 122.

In FIGS. 7 and 26, the CPU 120 used as a computer can be connected to a RAM (Random Access Memory), ROM, magnetic disk (HD) device or the like which is one example of the storage device via a bus (not shown). Further, the CPU 120 can be connected to a keyboard (K/B) or mouse which is one example of input means, a monitor or printer which is one example of output means, or an external interface (I/F), FD, DVD or CD which is one example of input/output means.

(Modification)

This invention is not limited to the above embodiments. The configuration of the electron beam drawing apparatus is not limited to those shown in FIGS. 1, 7 and 26 and can be adequately modified according to the specification if the main/sub two deflection system can be used. Further, the sub deflector is not limited to the octopole electrode and any electrode can be used if it can deflect the electron beam at high speed. In the above embodiments, the electron beam drawing apparatus is explained as an example, but this invention can also be applied to an ion beam drawing apparatus.

Further, the explanation of the device configuration, control method and the like which are not directly required to explain the present invention is omitted, but the required device configuration and control method can be adequately selected and used. For example, the explanation of the configuration of the control unit which controls the drawing apparatus is omitted, but of course, the configuration of the required control unit can be adequately selected and used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged beam drawing apparatus which draws a desired pattern on a sample by use of a charged beam deflected in main/sub two stages, comprising:

a main deflector which deflects a charged beam, the main deflector sequentially selecting a plurality of sub-deflection drawing regions obtained by dividing a main deflection drawing region of a sample, a main deflection driving unit which drives the main deflector, a sub deflector which deflects the charged beam in the selected sub deflection region, the sub deflector drawing a pattern in the selected sub deflection region, and a sub deflection driving unit which drives the sub deflector, the sub deflection driving unit including a sub deflection sensitivity correction circuit which corrects deflection sensitivity according to a shot position in the sub deflection region, a sub deflection astigmatic correction circuit which corrects a deflection astigmatic point according to a shot position in the sub deflection region, an adder circuit which superimposes an output of the sub deflection sensitivity correction circuit and an output of the sub deflection astigmatic correction circuit and a deflection amplifier which applies an output of the adder circuit to the sub deflector.

2. The charged beam drawing apparatus according to claim 1, wherein the sub deflection driving unit divides the main deflection drawing region into meshes and has a memory which stores a sub deflection sensitivity correction coefficient and sub deflection astigmatic correction coefficient for each mesh.

3. The charged beam drawing apparatus according to claim 2, wherein the mesh is not smaller than the sub deflection region.

4. The charged beam drawing apparatus according to claim 2, wherein the sub deflection sensitivity correction circuit and sub deflection astigmatic correction circuit respectively read out a sub deflection sensitivity correction coefficient and sub deflection astigmatic correction coefficient corresponding to the position of the selected sub deflection region from the memory and perform correction operations according to a shot position in the selected sub deflection region based on the readout correction coefficients.

5. The charged beam drawing apparatus according to claim 2, wherein the sub deflection driving unit includes a sub deflection astigmatic correction value calculating unit which measures a preset inclination coefficient and a sub deflection astigmatic difference of a charged particle beam by scanning a preset mark in two perpendicularly intersecting directions by using the charged particle beam in which a sub deflection astigmatic point is corrected by use of an n-th sub deflection astigmatic correction value and calculates an (n+1)-th sub deflection astigmatic correction value in which no sub deflection astigmatic difference occurs based on the measured preset inclination coefficient and sub deflection astigmatic difference to derive the sub deflection astigmatic correction coefficient stored in the memory, and a sub deflection astigmatic correction coefficient calculating unit which repeatedly performs a calculating operation starting from the first correction value by the astigmatic correction value calculating unit until an absolute value of a difference between the n-th and (n+1)-th sub deflection astigmatic correction values becomes smaller than a preset value and calculates a sub deflection astigmatic correction coefficient which is a coefficient of a relational expression defining a sub deflection astigmatic correction amount by use of the (n+1)-th sub deflection astigmatic correction value which is finally obtained.

6. The charged beam drawing apparatus according to claim 1, wherein the sub deflection sensitivity correction circuit and sub deflection astigmatic correction circuit are configured to perform an operation in a pipeline system.

7. The charged beam drawing apparatus according to claim 1, wherein the sub deflection sensitivity correction circuit and sub deflection astigmatic correction circuit simultaneously and respectively perform a deflection sensitivity correcting process and deflection astigmatic correction process in parallel and the adder circuit adds outputs of the sub deflection sensitivity correction circuit and sub deflection astigmatic correction circuit in adequately adjusted timing.

8. The charged beam drawing apparatus according to claim 1, wherein the sub deflector is an octopole deflector having eight electrodes.

9. A charged beam drawing apparatus which draws a desired pattern on a sample by use of a charged beam deflected in main/sub two stages, comprising:

a sub deflection astigmatic correction value calculating unit which measures a preset inclination coefficient and a sub deflection astigmatic difference of the charged particle beam by scanning a preset mark in two perpendicularly intersecting directions by use of a charged particle beam in which a sub deflection astigmatic point is corrected by use of an n-th sub deflection astigmatic correction value and calculates an (n+1)-th sub deflection astigmatic correction value used to eliminate a sub deflection astigmatic difference based on the measured preset inclination coefficient and sub deflection astigmatic difference, a sub deflection astigmatic correction coefficient calculating unit which repeatedly performs an operation of calculating sub deflection astigmatic correction values starting from the first sub deflection astigmatic correction value by use of the astigmatic correction value calculating unit until an absolute value of a difference between the n-th and the (n+1)-th sub deflection astigmatic correction values becomes smaller than a preset value and calculates a sub deflection astigmatic correction coefficient which is a coefficient of a relational expression defining a sub deflection astigmatic correction amount by use of the (n+1)-th sub deflection astigmatic correction value which is finally obtained, and a drawing unit which draws a preset pattern on the sample by use of charged particle beam in which the sub deflection astigmatic point is corrected according to the relational expression containing the calculated sub deflection astigmatic correction coefficient.

10. The charged beam drawing apparatus according to claim 9, wherein the operation of calculating the sub deflection astigmatic correction coefficient is performed in a plurality of positions of the drawing region.

11. The charged beam drawing apparatus according to claim 9, wherein the operations of calculating the sub deflection astigmatic correction value and calculating the sub deflection astigmatic correction coefficient are performed in two perpendicularly intersecting directions different from the above two directions in addition to the above two directions.

12. The charged beam drawing apparatus according to claim 9, wherein the preset inclination coefficient is an inclination value of a variation amount of the sub deflection astigmatic difference when sub deflection astigmatic correction amounts in the two perpendicularly intersecting directions are used as variables.

13. A charged beam drawing method for drawing a desired pattern on a sample by use of a charged beam deflected in main/sub two stages, comprising:

measuring sub deflection astigmatic differences in two perpendicularly intersecting directions of a charged particle beam by scanning a preset mark in the two perpendicularly intersecting directions by use of the charged particle beam in which a sub deflection astigmatic point is corrected by use of an n-th sub deflection astigmatic correction value, calculating an (n+1)-th sub deflection astigmatic correction value used to eliminate a sub deflection astigmatic difference based on the n-th sub deflection astigmatic correction value, measured sub deflection astigmatic difference and preset inclination coefficient, determining whether an absolute value of a difference between the (n+1)-th sub deflection astigmatic correction value calculated and the n-th sub deflection astigmatic correction value used for calculation is smaller than a preset value, repeatedly performing operations of measuring the sub deflection astigmatic difference, calculating the sub deflection astigmatic correction value and determining whether the absolute value of the difference is smaller than the preset value starting from the first sub deflection astigmatic correction value and terminating the above operations when the absolute value of the difference between the (n+1)-th and n-th sub deflection astigmatic correction values becomes smaller than the preset value, and drawing a desired pattern on the sample by use of the charged particle beam subjected to astigmatic correction by use of an (n+1)-th sub deflection astigmatic correction value obtained when the difference becomes smaller than the preset value.

14. The charged particle beam drawing method according to claim 13, wherein (n+1)-th sub deflection astigmatic correction amounts in which the difference becomes smaller than a preset value are respectively calculated in a plurality of positions of the drawing region and a sub deflection astigmatic correction coefficient which is a coefficient of a relational equation defining the sub deflection astigmatic correction amount in each position of the drawing region is calculated by use of the (n+1)-th sub deflection astigmatic correction value calculated in each position.

15. The charged particle beam drawing method according to claim 13, wherein an inclination value of a variation amount of the sub deflection astigmatic difference is used as the preset inclination coefficient when sub deflection astigmatic correction amounts in the two perpendicularly intersecting directions are used as variables.

16. The charged particle beam drawing method according to claim 13, wherein an operation of measuring the sub deflection astigmatic difference in two perpendicularly intersecting directions different from the above two directions, calculating the sub deflection astigmatic correction value and determining whether the absolute value of the difference is smaller than the preset value is repeatedly performed from the first sub deflection astigmatic correction value and terminated when an absolute value of a difference between the (n+1)-th and n-th sub deflection astigmatic correction values becomes smaller than a preset value and the charged particle beam subjected to astigmatic correction by use of the (n+1)-th sub deflection astigmatic correction value obtained when the difference becomes smaller than the preset value is used to draw a pattern on a sample.

* * * * *